(12) United States Patent
Inoue

(10) Patent No.: US 6,992,928 B2
(45) Date of Patent: Jan. 31, 2006

(54) SEMICONDUCTOR MEMORY DEVICE WITH AN IMPROVED MEMORY CELL STRUCTURE AND METHOD OF OPERATING THE SAME

(75) Inventor: Yasukazu Inoue, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 167 days.

(21) Appl. No.: 10/411,700

(22) Filed: Apr. 11, 2003

(65) Prior Publication Data

US 2003/0235095 A1   Dec. 25, 2003

(30) Foreign Application Priority Data

Apr. 11, 2002   (JP) ............................... 2002-109833

(51) Int. Cl.
 *G11C 14/00*   (2006.01)
(52) U.S. Cl. ............. 365/185.08; 365/149; 365/185.05
(58) Field of Classification Search ........... 365/185.08, 365/149, 185.05
See application file for complete search history.

(56) References Cited

U.S. PATENT DOCUMENTS

| 5,623,442 A | 4/1997 | Gotou et al. |
| 6,282,118 B1 * | 8/2001 | Lung et al. ............ 365/185.08 |

FOREIGN PATENT DOCUMENTS

| JP | 7-78484 | 3/1995 |
| JP | 11-126492 | 5/1999 |

* cited by examiner

*Primary Examiner*—Huan Hoang
(74) *Attorney, Agent, or Firm*—Katten Muchin Rosenman LLP

(57) ABSTRACT

A semiconductor memory device includes a plurality of memory cells, each of which comprises a single pair of a volatile memory element and a non-volatile memory element, wherein the volatile memory element and the non-volatile memory element are electrically coupled to each other, and wherein the volatile memory element is also electrically coupled to a first bit line for transmitting a first bit signal, while the non-volatile memory element is also electrically coupled to a second bit line making a single pair with the first bit line for transmitting a second bit signal which is an inversion to the first bit signal.

25 Claims, 8 Drawing Sheets

SEMICONDUCTOR MEMORY DEVICE WITH AN IMPROVED MEMORY CELL STRUCTURE AND METHOD OF OPERATING THE SAME

BACKGROUND OF THE INVENTION

1. Field of the Invention

The present invention relates to a semiconductor memory device with an improved memory cell structure and a method of operating the same, and more particularly to a random access memory device with an improved memory cell structure, wherein each memory cell includes a pair of a non-volatile memory element and a volatile memory element, and a method of operating the semiconductor memory device.

All of patents, patent applications, patent publications, scientific articles and the like, which will hereinafter be cited or identified in the present application, will, hereby, be incorporated by references in their entirety in order to describe more fully the state of the art, to which the present invention pertains.

2. Description of the Related Art

In general, the DRAM cell is one of the lowest-cost memory cells. The DRAM cell is suitable for high speed performance, but is volatile and allows stored data to disappear upon power-off. Due to this volatility, the DRAM cell is unlikely to be used for a variety of mobile devices which need a reduced or lower power consumption. Another semiconductor device has been proposed, which both exhibits such a high speed performance as DRAM and takes such a reduced power consumption as non-volatile memories such as Flash memories. Instead of the volatile semiconductor memory cell typically the DRAM cell, one of the non-volatile semiconductor memory devices, for example a FRAM has already been known, which has a cell structure generally similar to the DRAM memory cell, except that a capacitor of the memory cell comprises a non-volatile material.

One of the conventional non-volatile semiconductor memory devices is disclosed in Japanese laid-open patent publication No. 11-126492. FIG. 1 is a circuit diagram illustrative of this conventional non-volatile semiconductor memory device. The non-volatile semiconductor memory device includes a memory cell array 1, a pre-charge circuit 2 connected to the memory cell array 1, a bit line selector 3 connected to the pre-charge circuit 2, a voltage adjusting circuit 4 connected to the bit line selector 3, and sense amplifiers SA connected to the voltage adjusting circuit 4.

The memory cell array 1 further includes a memory cell area 10 and a register area 11' which is positioned between the memory cell area 10 and the pre-charge circuit 2. The memory cell area 10 furthermore includes a plurality of memory cells Mo0 . . . Mom−1. Each of the memory cells Mo0 . . . Mom−1 includes a pair of a flash cell and a DRAM capacitor. The flash cell comprises a non-volatile transistor. The DRAM capacitor comprises a capacitor included in the normal DRAM cell. A drain of the non-volatile transistor serving as the flash cell is connected to a bit line BL. A source of the non-volatile transistor serving as the flash cell is connected to a first terminal of the DRAM capacitor. A second terminal of the DRAM capacitor is connected to a power terminal VPL.

The above conventional non-volatile semiconductor memory device operates in both a normal operation mode and a data holding mode. In the normal operation mode, data are stored in the DRAM capacitor, and the stored data are read out from the DRAM capacitor. In this normal operation mode, a high speed random access to the memory cell is obtained as in the normal DRAM cell. In the data holding mode, data are stored in the flash cell or the non-volatile transistor.

In the data holding mode, the flash cell serves as a non-volatile memory. In the normal operation mode, the flash cell serves as a switching transistor of the normal DRAM cell, wherein data are transmitted from a bit line through the flash cell to the DRAM capacitor, wherein the data are stored in the DRAM capacitor. The data stored in the DRAM capacitor are read out through the flash cell.

The non-volatile transistor constituting the flash cell not only serves as a non-volatile memory in the data holding mode, but also serves as a selective switching element whenever data read/write operations are made. Namely every time data are read or write, a word line is activated which is connected to a gate electrode of the non-volatile transistor, so that the non-volatile transistor turns ON. The above two operations as the switching element and the non-volatile memory element in both the normal operation mode and the data holding mode means that the non-volatile transistor is needed to perform an increased number of ON/OFF operations at a high ON/OFF switching speed, as compared to the normal case that the non-volatile transistor is simply operated as a non-volatile memory in the data holding mode only.

The non-volatile transistor constituting the flash cell is generally inferior in the high speed performance such as the ON-OFF switching operation and its cyclic characteristic or durability as compared to the normal switching transistor used in the DRAM cell. It is necessary for the non-volatile transistor to improve a cyclic characteristic or a durability of a gate insulation film material of the non-volatile transistor, and also improve a stability in performance of the non-volatile transistor. Even if an ideal gate insulating film with a superior film quality could be developed, then this may cause an increase in the cost of the non-volatile transistor.

Another example of the conventional non-volatile semiconductor memory devices is disclosed in Japanese laid-open patent publication No. 7-78484. FIG. 2 is an equivalent circuit diagram illustrative of a memory cell included in this conventional non-volatile semiconductor memory device. The memory cell comprises a selecting transistor Tr, and plural pairs of a capacitor Co comprising a parasitic capacitance, and a floating gate non-volatile memory transistor M. A drain of the floating gate non-volatile memory transistor M is connected through a sub-bit line SBL and a single selecting transistor Tr to a main bit line MBL. The sub-bit line SBL is connected through the selecting transistor Tr to the main bit line MBL. A source of the floating gate non-volatile memory transistor M is connected to a ground line GND.

It may equivalently be considered that each of the plural floating gate non-volatile memory transistors M has a parasitic capacitance Co connected to the source of the selecting transistor Tr in parallel to each of the plural floating gate non-volatile memory transistors M.

Illustration being omitted, in each memory cell, plural pairs of the floating gate non-volatile memory transistors M1–Mn and the parasitic capacitances C1–Cn are connected in parallel to each other through the single selecting transistor Tr to the main bit line MBL. Assuming that a parasitic capacitance Co* corresponds to a total sum of the parasitic capacitances C1–Cn, it may equivalently be considered that the parasitic capacitance Co* is connected through the selecting transistor Tr to the main bit line MBL.

In other words, it may also equivalently be considered that each of the memory cells comprises a non-volatile memory transistor Mk and a DRAM cell structure, wherein the non-volatile memory transistor Mk further comprises a plurality of the floating gate non-volatile memory transistors M1–Mn which are connected in parallel to each other to the source of the selecting transistor Tr, while the DRAM cell structure comprises a single selecting transistor Tr and the parasitic capacitance Co* corresponds to the total sum of the plural parasitic capacitances C1–Cn respectively provided by the plural floating gate non-volatile memory transistors M1–Mn.

This non-volatile memory transistor not only stores data in the data holding mode but also operates as the normal capacitive element in the normal DRAM cell for read and write operations in the normal operation mode. Every time of the data read and write operations, there rises a word line connected to a gate electrode of the non-volatile memory transistor Mk for causing the non-volatile memory transistor Mk to turn ON. The operations in the normal operation mode include a large number of ON/OFF switching operations of the transistor and need the high speed ON/OFF switching operations of the transistor as compared to the other operations as memory transistor in the data holding mode.

It is the fact that the non-volatile memory transistor is in general inferior in the high speed performance and cyclic characteristic of the ON/OFF switching operations, as compared to the selecting transistor used in the normal DRAM cell. For this reason, it is necessary for the non-volatile memory transistor to improve a cyclic characteristic or a durability of a gate insulation film material of the non-volatile memory transistor, and also improve a stability in performance of the non-volatile memory transistor. Even if an ideal gate insulating film with a superior film quality could be developed, then this may cause an increase in the cost of the non-volatile memory transistor.

In accordance with the above-described conventional techniques, the non-volatile transistor not only serves as the non-volatile memory in the data holding mode, but also serves as the selective switching element whenever data read/write operations are made. Therefore, it is necessary for the non-volatile memory transistor to improve a cyclic characteristic or a durability of a gate insulation film material of the non-volatile memory transistor, and also improve a stability in performance of the non-volatile memory transistor. Even if an ideal gate insulating film with a superior film quality could be developed, then this may cause an increase in the cost of the non-volatile memory transistor.

In the above circumstances, there is desired the development of a novel semiconductor memory device and a method of controlling the same, free from the above problems.

SUMMARY OF THE INVENTION

Accordingly, it is an object of the present invention to provide a novel semiconductor memory device free from the above problems.

It is a further object of the present invention to provide a novel method of controlling a semiconductor memory device free from the above problems.

The present invention provides a semiconductor memory device including a plurality of memory cells, each of the plural memory cells comprising a single pair of a volatile memory element and a non-volatile memory element, wherein the volatile memory element and the non-volatile memory element are electrically coupled to each other, and wherein the volatile memory element is also electrically coupled to a first bit line for transmitting a first bit signal, while the non-volatile memory element is also electrically coupled to a second bit line making a single pair with the first bit line for transmitting a second bit signal which is an inversion to the first bit signal.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTION OF THE PREFERRED EMBODIMENTS

Figure 1:
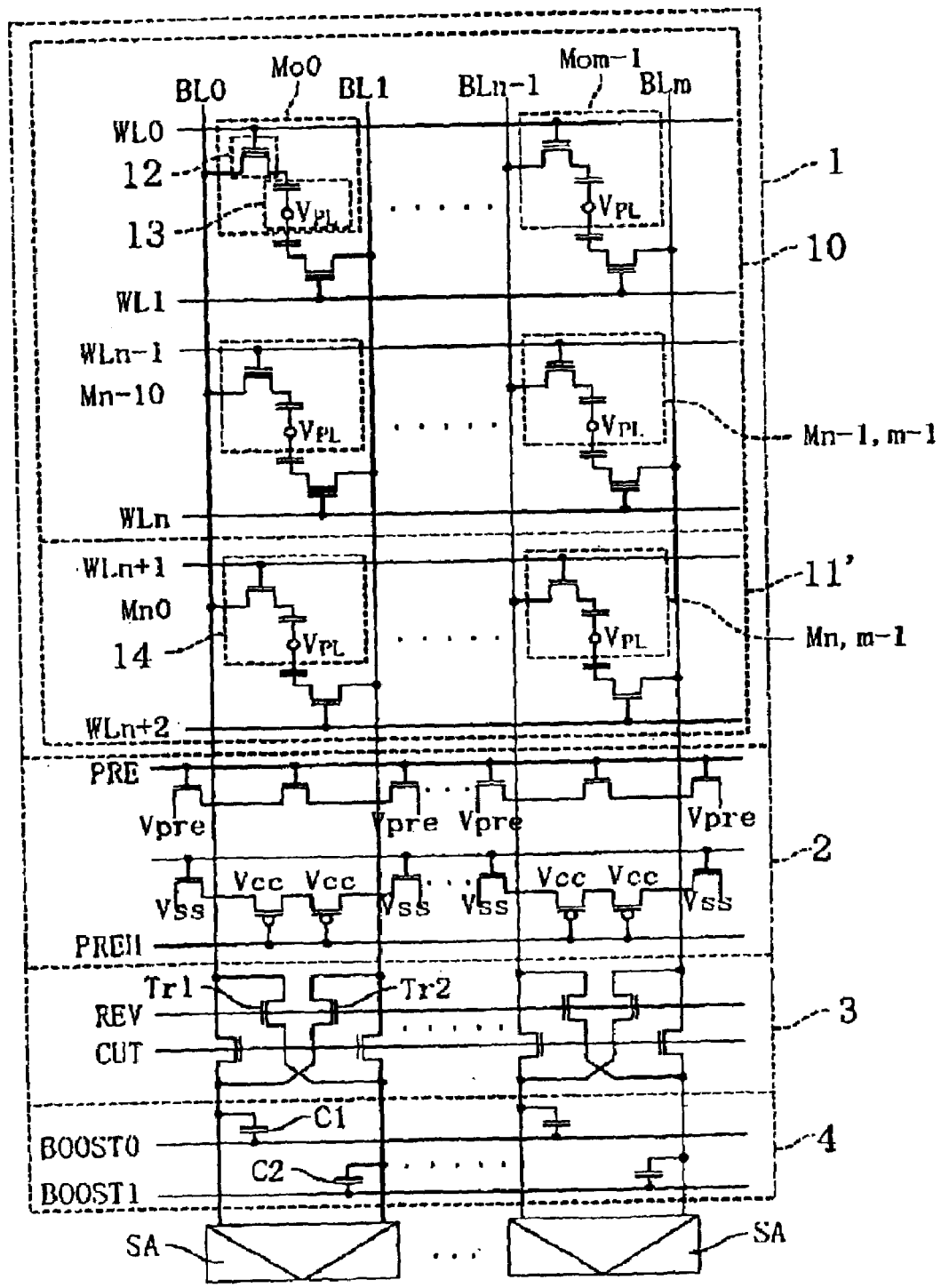
FIG. 1 is a circuit diagram illustrative of a cell structure of the conventional non-volatile semiconductor memory device.
Figure 2:
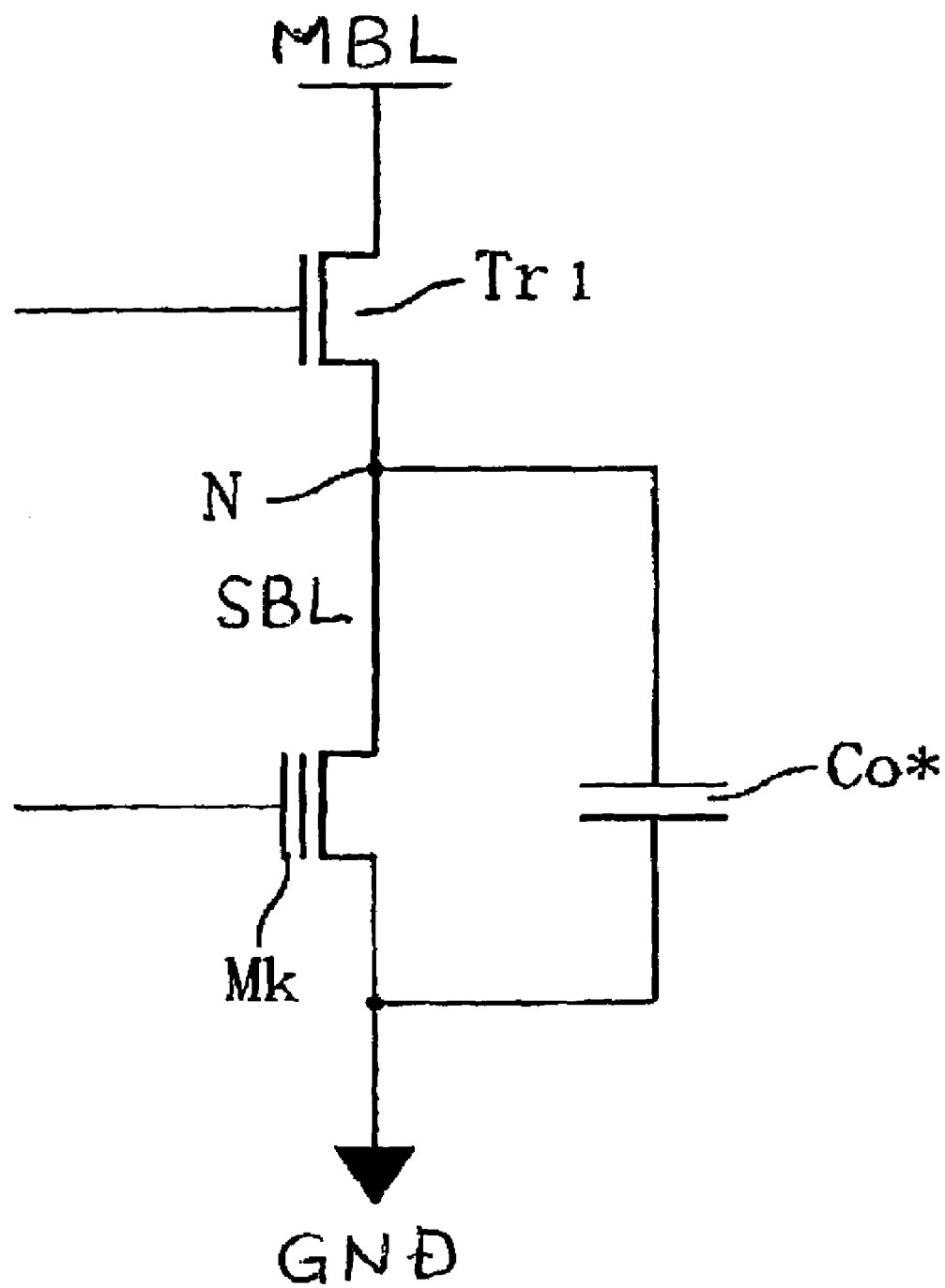
FIG. 2 is an equivalent diagram illustrative of a memory cell included in the conventional non-volatile semiconductor memory device.

A first aspect of the present invention is a semiconductor memory device including a plurality of memory cells, each of the plural memory cells comprising a single pair of a volatile memory element and a non-volatile memory element, wherein the volatile memory element and the non-volatile memory element are electrically coupled to each other, and wherein the volatile memory element is also electrically coupled to a first bit line for transmitting a first bit signal, while the non-volatile memory element is also electrically coupled to a second bit line making a single pair with the first bit line for transmitting a second bit signal which is an inversion to the first bit signal.

It is possible that the volatile memory element includes a cell selecting element, and the cell selecting element and the non-volatile memory element are connected in series between the first and second bit lines.

It is possible that the volatile memory element comprises a cell selecting element and a storage capacitive element, that the cell selecting element and the non-volatile memory element are connected in series between the first and second bit lines, and that a storage electrode of the storage capacitive element is electrically connected through the cell selecting element to the first bit line, and also is electrically connected through the non-volatile memory element to the second bit line.

It is further possible that the cell selecting element comprises an MOS transistor, and the non-volatile memory element comprises a memory element which varies in a threshold voltage of a control electrode upon a hot carrier injection.

It is also possible that the cell selecting element and the non-volatile memory element, both of which are included in each of the plural memory cells, are commonly connected through a single common storage electrode contact to the storage electrode of the storage capacitive element.

It is further possible that the cell selecting element and the non-volatile memory element, both of which are respectively included in adjacent two of the plural memory cells aligned in a direction substantially perpendicular to an extending direction of the first and second bit lines, are commonly connected through a single common bit line contact to one of the first and second bit lines.

It is further more possible that the cell selecting element and the non-volatile memory element, both of which are respectively included in adjacent two of the plural memory cells aligned in the extending direction of the first and second bit lines, are electrically connected to the same one of the first and second bit lines.

A second aspect of the present invention is a memory cell structure comprising a plurality of memory cells, each of the plural memory cells comprising a single pair of a volatile memory element and a non-volatile memory element, wherein the volatile memory element and the non-volatile memory element are electrically coupled to each other, and wherein the volatile memory element is also electrically coupled to a first bit line for transmitting a first bit signal, while the non-volatile memory element is also electrically coupled to a second bit line making a single pair with the first bit line for transmitting a second bit signal which is an inversion to the first bit signal.

It is possible that the volatile memory element includes a cell selecting element, and the cell selecting element and the non-volatile memory element are connected in series between the first and second bit lines.

It is also possible that the volatile memory element comprises a cell selecting element and a storage capacitive element, that the cell selecting element and the non-volatile memory element are connected in series between the first and second bit lines, and that a storage electrode of the storage capacitive element is electrically connected through the cell selecting element to the first bit line, and also is electrically connected through the non-volatile memory element to the second bit line.

It is possible that the cell selecting element comprises an MOS transistor, and the non-volatile memory element comprises a memory element which varies in a threshold voltage of a control electrode upon a hot carrier injection.

It is possible that the cell selecting element and the non-volatile memory element, both of which are included in each of the plural memory cells, are commonly connected through a single common storage electrode contact to the storage electrode of the storage capacitive element.

It is possible that the cell selecting element and the non-volatile memory element, both of which are respectively included in adjacent two of the plural memory cells aligned in a direction substantially perpendicular to an extending direction of the first and second bit lines, are commonly connected through a single common bit line contact to one of the first and second bit lines.

It is possible that the cell selecting element and the non-volatile memory element, both of which are respectively included in adjacent two of the plural memory cells aligned in the extending direction of the first and second bit lines, are electrically connected to the same one of the first and second bit lines.

A third aspect of the present invention is a semiconductor memory device including: a semiconductor substrate of a first conductivity type; first, second and third diffusion regions of a second conductivity type which are selectively formed and separated from each other in the semiconductor substrate; a first bit line electrically connected through a first contact to the first diffusion region; a second bit line electrically connected through a second contact to the second diffusion region, and the second bit line making a pair with the first bit line, and the first and second bit lines which respectively transmit first and second bit signals which have relative inversion relationships to each other; a storage capacitive element electrically connected through a third contact to the third diffusion region; a cell selecting element including a first control electrode between the first and third contacts, a first electrode region comprising the first diffusion region, and a third electrode region comprising the third diffusion region; and a non-volatile memory element including a second control electrode between the second and third contacts, a second electrode region comprising the second diffusion region, and the third electrode region comprising the third diffusion region.

It is possible that the non-volatile memory element comprises a non-volatile transistor having a floating gate electrode.

It is also possible that the floating gate electrode is smaller in width than the second control electrode.

It is further possible that the floating gate electrode is positioned under a first half region of the second control gate electrode, so that the floating gate electrode overlaps a hot carrier injection region in plan view.

A fourth aspect of the present invention is a method of controlling operation of a semiconductor memory device including a plurality of memory cells, each of the plural memory cells comprising a single pair of a volatile memory element and a non-volatile memory element which are electrically coupled in series between paired first and second bit lines respectively transmitting first and second bit signals having relative inversion relationships to each other. When the semiconductor memory device is in a power-on state, then the non-volatile memory element is in a non-operation state, while the volatile memory element is an operation state to store and hold cell data. When the semiconductor memory device is transitioned from the power-on state to one of a power-off state and a power consumption saving state, then cell data stored in the volatile memory element are transferred to and stored into the non-volatile memory element. When semiconductor memory device is in one of the power-off state and the power consumption saving state, then no refresh operation is made. When the semiconductor memory device is transitioned from one of the power-off state and the power consumption saving state to the power-on state, then cell data stored in the non-volatile memory element are transferred to and stored into the volatile memory element.

It is possible that the transfer of the cell data to the non-volatile memory element from the volatile memory element includes the steps of:

fixing the first bit line electrically connected to the volatile memory element at a potential which corresponds to the cell data stored in the volatile memory element, and also fixing the second bit line at another potential which has an inversion relationship of the potential of the first bit line; and placing the non-volatile memory element into a conductive state, so that a potential difference between the first and second bit lines causes a current flow between the first and second bit lines through a series connection of the volatile memory element and the non-volatile memory element, thereby storing the cell data into the non-volatile memory element.

It is possible that the transfer of the cell data to the volatile memory element from the non-volatile memory clement includes the steps of:

placing the non-volatile memory element into a non-conductive state if the non-volatile memory element has stored cell data, and leaving the non-volatile memory element into the conductive state if the non-volatile memory element has not stored cell data; and applying all of the bit lines with a voltage which corresponds to data, which had stored in the volatile memory element before the semiconductor memory device has been transitioned from the power-on state to one of the power-off state and the power consumption saving state, where the volatile memory element is included in the same memory cell as the non-volatile memory element having not stored cell data.

It is further possible that the placing step is carried out by applying a control voltage to control electrodes of all of the non-volatile memory elements, and the control voltage is lower than an increased threshold voltage of the non-volatile memory element having stored cell data, and higher than an original threshold voltage of the non-volatile memory element having not stored cell data.

A fifth aspect of the present invention is a method of transferring data from a volatile memory element to a non-volatile memory element which is included in a single memory cell together with the volatile memory element, wherein the volatile memory element and the non-volatile memory element are connected in series between paired first ands second bit lines which respectively transfer first and second bit signals having relative inversion relationships to each other.

The method includes: fixing the first bit line electrically connected to the volatile memory element at a potential which corresponds to the cell data stored in the volatile memory clement, and also fixing the second bit line at another potential which has an inversion relationship of the potential of the first bit line; and placing the non-volatile memory element into a conductive state, so that a potential difference between the first and second bit lines causes a current flow between the first and second bit lines through a series connection of the volatile memory element and the non-volatile memory element, thereby storing the cell data into the non-volatile memory element.

A sixth aspect of the present invention is a method of transferring data from a non-volatile memory element to a volatile memory element which is included in a single memory cell together with the non-volatile memory element, wherein the volatile memory element and the non-volatile memory element are connected in series between paired first ands second bit lines which respectively transfer first and second bit signals having relative inversion relationships to each other.

The method includes: placing the non-volatile memory element into a non-conductive state if the non-volatile memory element has stored cell data, and leaving the non-volatile memory element into the conductive state if the non-volatile memory element has not stored cell data; and applying all of the bit lines with a voltage which corresponds to data, which had stored in the volatile memory element before the semiconductor memory device has been transitioned from the power-on state to one of the power-off state and the power consumption saving state, where the volatile memory element is included in the same memory cell as the non-volatile memory element having not stored cell data.

It is possible that the placing step is carried out by applying a control voltage to control electrodes of all of the non-volatile memory elements, and the control voltage is lower than an increased threshold voltage of the non-volatile memory element having stored cell data, and higher than an original threshold voltage of the non-volatile memory element having not stored cell data.

In accordance with the semiconductor memory device of the present invention, each memory cell comprises a single pair of a volatile memory element and a non-volatile memory element which are electrically coupled to each other. The volatile memory element is electrically coupled to first one of paired bit lines. The non-volatile memory element is electrically coupled to second one of the paired bit lines. The volatile memory element and the non-volatile memory element respectively comprise elements physically different from each other. In the normal operation mode for read write operations, only the volatile memory clement operates, while the non-volatile memory element does not operate and is in a resting state. In the data holding mode, only the non-volatile memory element operates, while the volatile memory element does not operate and is in the resting state. Namely, when the semiconductor memory device is transitioned from the normal operation mode to the data holding mode, data are written or stored into the non-volatile memory element. When the semiconductor memory device is transitioned from the data holding mode to the normal operation mode, the stored data are read from the non-volatile memory element.

In a case that the non-volatile memory element comprises a non-volatile memory transistor, this non-volatile memory transistor does not operate in the normal operation mode for the data read and write operations. This non-volatile memory transistor is not needed to have the high speed performance of the ON/OFF switching operations as the selecting transistor used in the normal DRAM cell, and further a gate insulating film material of this non-volatile memory transistor is also not needed to have a high quality and a high cyclic characteristic or a high durability. Namely, the presently available non-volatile memory transistors are available for the non-volatile memory transistor included in the semiconductor memory device of the present invention. Any improvement in the performances and characteristics of the presently practiced non-volatile transistor is needed for realizing the semiconductor memory device of the present invention. This allows a high flexibility in design of the semiconductor memory device and also a possible reduction in the cost thereof.

In the normal operation mode, only the volatile memory element operates. This allows that the volatile memory element comprises a single pair of a selecting transistor and a capacitor, similarly to the conventional and normal DRAM cell, thereby making it possible to improve the high speed performance of the semiconductor memory device in the normal operation mode.

The novel memory cell structure of the present invention needs to further provide the non-volatile memory element in addition to the normal DRAM cell structure, so that the novel memory cell structure not only takes the same advantages as the normal DRAM such as the high speed performance but also compensates the disadvantages of the normal DRAM, for example, does not need to perform any refresh operations during the power-off state or the power consumption saving state such as the stand-by state in order to suppress the power consumption.

The sectioned structure of the semiconductor memory device of the present invention is different from that of the DRAM but only in view of the gate insulating structure of the non-volatile memory element. A small number of the additional fabrication processes for forming the gate insulating film structure is added to the normal fabrication processes for fabricating the normal DRAM. The fabrication processes for fabricating the novel semiconductor memory device of the present invention are identical with the fabrication processes for fabricating the normal DRAM except for the small number of the additional fabrication processes for fabricating the gate insulating film structure. These additional fabrication processes are not complicated processes nor special processes. For those reasons, the novel semiconductor memory device takes the advantages of the large-scale mass-production through the existent and established manufacturing processes using the existent semiconductor manufacturing equipment, thereby realizing the desired cost down.

The volatile memory element and the non-volatile memory element are integrated in the single memory cell. This allows an extremely high speed data transfer between the volatile memory element and the non-volatile memory element in the single memory cell. This realizes the desired improvement in the high speed performance of the novel semiconductor memory device. In addition, no special data transfer line is needed between the volatile memory element and the non-volatile memory element in the single memory cell. This contributes to further reduce the occupied area of the memory cell array.

The above cell structure incorporating or integrating both the volatile memory clement and the non-volatile memory element in the single memory cell does not need any change in the cell array structure from the existent DRAM cell array structure. No change to the bit line layout nor addition of further bit line are necessary. With no increase of the number of the bit lines from that of the normal DRAM nor change to the connection configuration of the bit line pair and the sense amplifier from that of the normal DRAM, it is possible to suppress or reduce the occupied area of the memory cell array region as well as take a great deal of advantage in the large scale mass-production with a large cost down, similarly to the DRAM, through the existent and established manufacturing process techniques by using the existent semiconductor manufacturing equipments.

The present invention needs a minimum increase in the number of word lines from that of the DRAM. The single time word address scanning operation transfer data from the volatile memory element to the non-volatile memory element in each of the memory cells, without any complicated and specific word selecting operations.

The existent peripheral circuit configurations and the existent control circuit configurations usable in the DRAM are simply applicable to the above-described novel semiconductor memory device of the present invention, with no addition of any specific peripheral circuit or control circuit nor increase in the occupied area of the circuit region. This takes the same advantages as the DRAM, for example, the large-scale mass-production effect through the existent manufacturing process techniques using the existent semiconductor manufacturing equipments, thereby realizing the desired large cost down.

The control operation techniques needed for the DRAM are also simply applicable to control the operations of the novel semiconductor memory device of the present invention, with no complicated control operations nor special and highly precise control operations, thereby improving the controllability and the stability of the operations thereof in addition to the above-described plural effects and advantages.

The novel semiconductor memory device of the present invention needs the minimum operations for transfer of data between the volatile memory element and the non-volatile memory element in the same memory cell, in order to reduce the number of the necessary injection of hot carriers into the non-volatile memory element. This reduction in the number of the necessary hot carrier injection relaxes the requirements for the durability of the non-volatile memory element, particularly for the film quality of the gate insulating film thereof. This relaxation increases the design flexibility of the memory cell structure, and also improve the yield of the semiconductor memory device.

The each storage electrode contact with the storage electrode of the storage capacitive element is common to both the non-volatile memory element and the cell selecting MOS transistor, both of which are included in the single memory cell, in order to suppress or reduce the occupied area of the memory cells.

In addition, the bit line contact to the bit line is also common to adjacent two of the non-volatile memory elements and the cell selecting MOS transistors, in order to suppress or reduce an occupied area of the memory cells.

Further, the opposite electrode of the storage capacitive elements is also common to both the adjacent two memory cells, in order to suppress or reduce an occupied area of the memory cells.

The following embodiments are typical examples for practicing the foregoing aspects of the present invention. Although the subject matters of the present invention have been described in details, the following additional descriptions in one or more typical preferred embodiments or examples will be made with reference to the drawings for making it easy to understand the typical modes for practicing the foregoing aspects of the present invention.

First Embodiment

Figure 3:
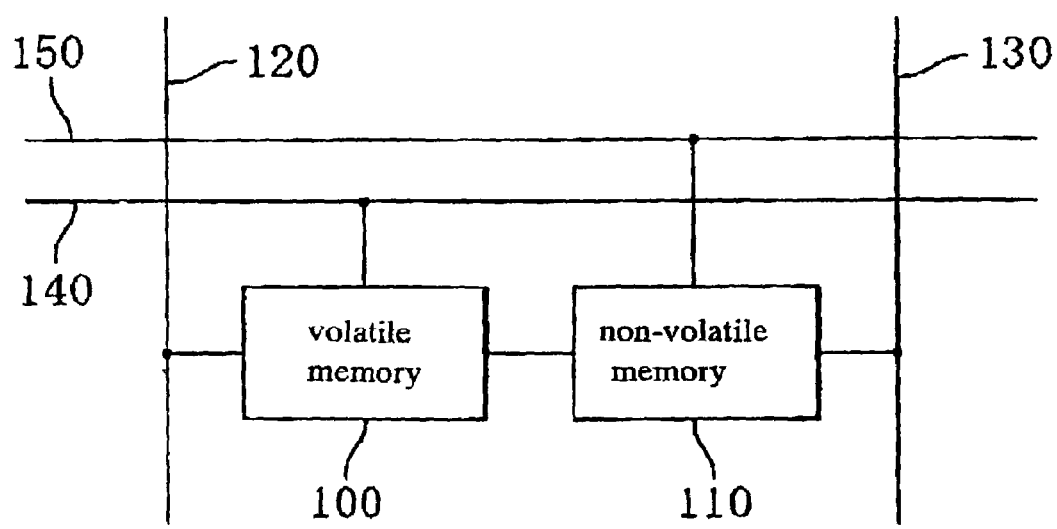
FIG. 3 is a block diagram illustrative of a novel memory cell structure of a semiconductor memory device in accordance with the present invention.

A first embodiment according to the present invention will be described in detail with reference to the drawings. FIG. 3 is a block diagram illustrative of a novel memory cell structure of a semiconductor memory device in accordance with the present invention. Each memory cell of the semiconductor memory device of the present invention is different in circuit configuration from that of the conventional semiconductor memory devices. The semiconductor memory device has a plurality of memory cells, each of which includes a single pair of a volatile memory element 100 and a non-volatile memory element 110 electrically coupled to the volatile memory element 100. First and second bit lines 120 and 130 make a single pair. The volatile memory element 100 is also electrically coupled to the first bit line 120, while the non-volatile memory element 110 is electrically coupled to the second bit line 130. A variety of known semiconductor devices are available for the volatile memory element 100 and the non-volatile memory element 110. The first and second bit lines 120 and 130 making the single pair are respectively to transfer first type data signals and second type data signals which correspond to inversion signals to the first type data signals. Namely, the data signal and the inverted data signals are transmitted on the paired first and second bit lines 120 and 130 respectively. Each pair of the first and second bit lines 120 and 130 may, for example, be electrically coupled to each of sense amplifiers.

The volatile memory element 100 is used to store data in the normal operation mode, wherein the semiconductor memory device is in a power-on state and performs high speed data read and write operations. The non-volatile memory element 110 is used to store data in place of the volatile memory element 100 in a power-off state or a power consumption saving mode such as a stand-by state, wherein the non-volatile memory element 110 stores the data which have been transferred from the volatile memory element 100.

In the power-off state or the power consumption saving mode, even if the volatile memory element 100 loses the data once stored, then the non-volatile memory element 110 securely holds the same data instead of the volatile memory element 100. For this reason, no refresh operation is needed to the volatile memory element 100 in the power-off state or the power consumption saving mode. No refresh operation being needed allows a possible reduction in the power consumption in the power-off state or the power consumption saving mode.

When the semiconductor memory device is placed into the power-on state, the data stored in the non-volatile memory element 110 are read out from it and transferred to the volatile memory element 100, so that the semiconductor memory device is back to the past state immediately before the entry into the power-off state or the power consumption saving mode As a result, the semiconductor memory device can operate the normal read and write operations in the normal operation mode.

The volatile memory element 100 and the non-volatile memory element 110 are further electrically coupled to first and second selecting signal lines 140 and 150, respectively, so that the volatile memory element 100 and the non-volatile memory element 110 respectively receive first and second selecting signals as transmitted through the first and second selecting signal lines 140 and 150 which are independent from each other, so that one of the volatile memory element 100 and the non-volatile memory element 110 is selected to store the data based on the normal operation mode, or the power-off state or the power consumption saving mode. Namely, the volatile memory element 100 is electrically coupled to the first selecting signal line 140 which transmits the first selecting signal for selecting the volatile memory element 100, while the non-volatile memory element 110 is electrically coupled to the second selecting signal line 150 which transmits the second selecting signal for selecting the non-volatile memory element 110. The power-on state causes the semiconductor memory device to be in the normal operation mode. The power-off state or the stand-by state causes the semiconductor memory device to be in the power consumption saving mode.

When the semiconductor memory device is placed in the power-on state and in the normal operation mode, only the volatile memory element 100 operates for the data read and write operations, while the non-volatile memory element 110 does not operate. Therefore, the control signal for controlling the data read and write operations is transmitted through the first selecting signal line 140 to the volatile memory element 100.

A request for transition of the semiconductor memory device into the power-off state or the power consumption saving mode is generated, data stored in the volatile memory element 100 are transferred directly or indirectly to the non-volatile memory element 110, so that the transferred data are stored in the non-volatile memory element 110, based on both the first selecting signal on the first selecting signal line 140 and the second selecting signal on the second selecting signal line 150.

After the operations of storing the data into the non-volatile memory element 110 have been completed, then the transition of the semiconductor memory device into the power-off state or the power consumption saving mode is completed. In the power-off state or the power consumption saving mode, the non-volatile memory element 110 stores the same data as the data stored in the volatile memory element 100, for which reason no refresh operation is made to the volatile memory element 100. In the power-off state or the power consumption saving mode, the first and second selecting signals are not supplied through the first and second selecting signal lines 140 and 150. No refresh operations to the volatile memory element 100 allows the reduction in the power consumption of the semiconductor memory device.

Another request for transition of the semiconductor memory device into the power-on state from the power-off state or the power consumption saving mode is generated, the data stored in the non-volatile memory element 110 are read out from it and transferred directly or indirectly to the volatile memory element 100, so that the transferred data are stored in the volatile memory element 100, based on both the first selecting signal on the first selecting signal line 140 and the second selecting signal on the second selecting signal line 150. As a result, the semiconductor memory device is back to the past state immediately before the entry into the power-off state or the power consumption saving mode. As a result, the semiconductor memory device can operate the normal read and write operations in the normal operation mode.

As described above, each of the memory cells of the semiconductor memory device in accordance with the present invention comprises the single pair of the volatile memory element 100 and the non-volatile memory element 110, both of which are electrically coupled to each other. The volatile memory element 100 is also electrically coupled to the first bit line 120, while the non-volatile memory element 110 is also electrically coupled to the second bit line 130, wherein the first and second bit lines 120 and 130 make the single bit line pair and transfer the first and second data signals, which have inversion relationships to each other. Since a variety of the known elements or devices are available for the volatile memory element 100 and the non-volatile memory element 110, it is possible to achieve the above-described objects with the minimum design change to the circuit configuration of the normal DRAM cell.

The following descriptions are made by taking one typical case, wherein the volatile memory element 100 comprises the normal DRAM element, while the non-volatile memory element 110 comprises a flash memory element as a typical one of the non-volatile memory elements which varies in a threshold voltage of a control electrode thereof upon receipt of a hot carrier injection. The following descriptions focus onto different points in structure and operation from the DRAM, while descriptions about the same structure and the same operation as the DRAM are omitted.

Figure 4:
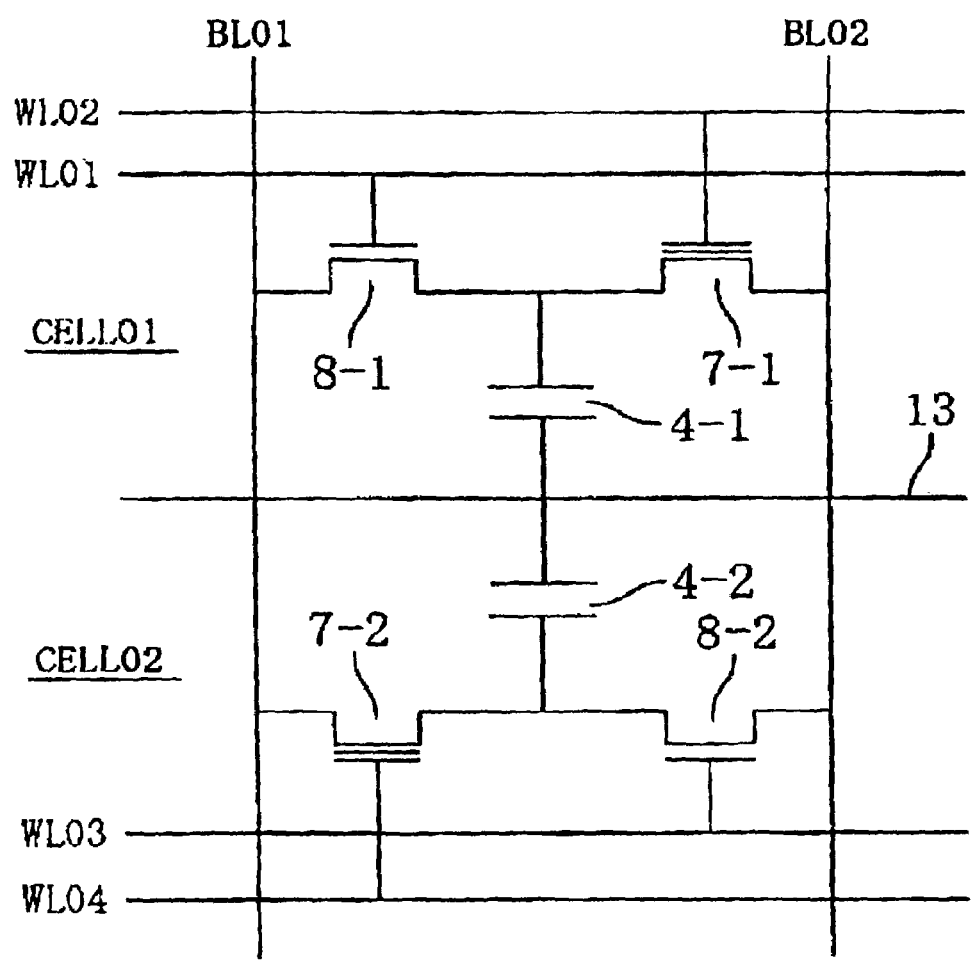
FIG. 4 is a circuit diagram illustrative of adjacent two memory cells included in a novel semiconductor memory device in accordance with the present invention.

FIG. 4 is a circuit diagram illustrative of adjacent two memory cells included in a novel semiconductor memory device in accordance with the present invention. First and second memory cells CELL01 and CELL02 are adjacent to each other. The first memory cell CELL01 comprises an MOS transistor 8-1 for selecting the cell, a storage capacitive element 4-1 and a non-volatile memory element 7-1. The cell selecting MOS transistor 8-1 and the storage capacitive element 4-1 constitute the volatile memory element 100. The non-volatile memory element 7-1 constitutes the non-volatile memory element 110. The non-volatile memory element 7-1 may comprise a non-volatile transistor which varies in a threshold voltage of a control electrode thereof upon receipt of a hot carrier injection.

The cell selecting MOS transistor 8-1 and the non-volatile memory element 7-1 are connected in series between paired first and second bit lines BL01 and BL02. In this first memory cell CELL01, the cell selecting MOS transistor 8-1 is electrically connected to the first bit line BL01, while the non-volatile memory element 74 is electrically connected to the second bit line BL02. The paired first and second bit lines BL01 and BL02 transmit first and second bit signals which have inversion relationships relative to each other. Even though illustration is omitted, the paired first and second bit lines BL01 and BL02 are electrically connected to a sense amplifier which is normally used in the DRAM, so that the paired first and second bit lines BL01 and BL02 transmit first and second bit signals which have inversion relationships relative to each other.

A gate electrode of the cell selecting MOS transistor 8-1 is electrically connected to a first word line WL01. A control electrode of the non-volatile memory element 7-1 is electrically connected to a second word line WL02. The first and second word lines WL01 and WL02 are allocated with the same word address ADD01.

The storage capacitive element 4-1 may comprise a capacitor which further comprises a storage electrode, a dielectric film and an opposite electrode 13. The storage electrode of the storage capacitive element 4-1 is electrically connected to a connection point between the cell selecting MOS transistor 8-1 and the non-volatile memory element 7-1, so that the storage electrode of the storage capacitive element 4-1 is electrically connected through the cell selecting MOS transistor 8-1 to the first bit line BL01 indirectly, and also electrically connected through the non-volatile memory element 7-1 to the second bit line BL02 indirectly. The opposite electrode 13 of the storage capacitive element 4-1 is a common electrode to the adjacent second memory cell CELL02.

The second memory cell CELL02 comprises another MOS transistor 8-2 for selecting the cell, another storage capacitive element 4-2 and another non-volatile memory element 7-2. The cell selecting MOS transistor 8-2 and the storage capacitive element 4-2 constitute the volatile memory element 100. The non-volatile memory element 7-2 constitutes the non-volatile memory element 110. The non-volatile memory element 7-2 may comprise a non-volatile transistor which varies in a threshold voltage of a control electrode thereof upon receipt of a hot carrier injection.

The cell selecting MOS transistor 8-2 and the non-volatile memory element 7-2 are connected in series between paired first and second bit lines BL01 and BL02. In this second memory cell CELL02, the cell selecting MOS transistor 8-2 is electrically connected to the second bit line BL02, while the non-volatile memory element 7-2 is electrically connected to the first bit line BL01.

A gate electrode of the cell selecting MOS transistor 8-2 is electrically connected to a third word line WL03. A control electrode of the non-volatile memory element 7-2 is electrically connected to a fourth word line WL04. The third and fourth word lines WL03 and WL04 are allocated with the same word address ADD02.

The storage capacitive element 4-2 may comprise a capacitor which further comprises another storage electrode, another dielectric film and the opposite electrode 13. The storage electrode of the storage capacitive element 4-2 is electrically connected to a connection point between the cell selecting MOS transistor 8-2 and the non-volatile memory element 7-2, so that the storage electrode of the storage capacitive element 4-2 is electrically connected through the cell selecting MOS transistor 8-2 to the second bit line BL02 indirectly, and also electrically connected through the non-volatile memory element 7-2 to the first bit line BL01 indirectly. The opposite electrode 13 of the storage capacitive element 4-2 is the common electrode to the adjacent first memory cell CELL01.

The single opposite electrode is commonly used by both the first and second memory cells CELL01 and CELL02, in order to suppress any increase in an occupied area by the adjacent first and second memory cells CELL01 and CELL02, even this structure is optional but not essential.

The novel memory cell structure of the present invention needs to further provide the non-volatile memory element in addition to the normal DRAM cell structure and also an additional word line connected to the control electrode of the non-volatile memory element. The word line is connected to the gate electrode of the cell selecting MOS transistor in the DRAM cell structure, while the additional word line is connected to the control electrode of the non-volatile memory element. These paired word lines are allocated with the same row address, so as to realize a word driver which includes a selecting circuit for independently selecting each of the paired word line. Further, a state-detecting circuit is provided for detecting each state of the semiconductor memory device, for example, the power-on state, the power-off state, and the power consumption saving state such as the stand-by state, wherein the static-detecting circuit is electrically coupled to the selecting circuit included in the word driver, so that the selecting circuit selects the paired word lines independently from each other, based on a detecting signal from the state-detecting circuit.

The basic structure of the memory cell array, the number of the bit lines, the sense amplifiers, column decoders, row decoders and refresh circuit for refresh operations and other peripheral circuits and control circuits may be the same in structure and inter-connections as these of the normal DRAM. Detailed descriptions in structure and inter-connections of the above will thus be omitted. Prior to descriptions about the effect provided by the above-described novel cell structure, operations of the circuits constituting the above-described novel memory cell shown in FIG. 4 will subsequently be described.

When the semiconductor memory device is placed in the power-on state and in the normal operation mode, the non-volatile memory element 7-1 in the first memory cell CELL01 and the non-volatile memory element 7-2 in the second memory cell CELL02 are placed in a non-conductive state and do not operate, Accordingly, the operations of the semiconductor memory device are the same as the normal read/write operations of the normal DRAM. In the first memory cell CELL01, the first word line WL01 is selected to place the cell selecting MOS transistor 8-1 into the conductive state. Data on the first bit line BL01 are transmitted through the cell selecting MOS transistor 8-1 to the storage capacitive element 4-1, so that the data are stored in the storage electrode of the storage capacitive element 4-1. In the second memory cell CELL02, the third word line WL03 is selected to place the cell selecting MOS transistor 8-2 into the conductive state. Data on the second bit line BL02 are transmitted through the cell selecting MOS transistor 8-2 to the storage capacitive element 4-2, so that the data are stored in the storage electrode of the storage capacitive element 4-2.

In the normal operation mode, a refresh operation is necessary for holding the data once stored in each memory cell. This refresh operation may be made in accordance with the known refresh method available to the normal DRAM. As described above, in the normal operation mode, the non-volatile memory element 7-1 in the first memory cell CELL01 and the non-volatile memory element 7-2 in the second memory cell CELL02 are placed in the non-conductive state. The first word line WL01 is selected to refresh the data stored in the storage capacitive element 4-1 in the first memory cell CELL01. The third word line WL03 is selected to refresh the data stored in the storage capacitive element 4-2 in the second memory cell CELL02.

Upon a request for transition of the semiconductor memory device to the power-off state or the power consumption saving mode such as the stand-by state, the data stored in the storage electrode of the storage capacitive element 4-1 in the first memory cell CELL01 are transferred to the non-volatile memory element 7-1 in the first memory cell CELL01, as well as the data stored in the storage electrode of the storage capacitive element 4-2 in the second memory cell CELL02 are transferred to the non-volatile memory element 7-2 in the second memory cell CELL02. These data transfer operations are unique to the present invention, but are not made in the normal DRAM.

In the semiconductor memory device, a transition-request detecting circuit is provided for detecting any request for transition of the semiconductor memory device into the power-off state or the power consumption saving mode such as the stand-by state. This transition-request detecting circuit may comprise a known detecting circuit such as a voltage sense circuit.

When the transition-request detecting circuit detected a generation of the request for transition of the semiconductor memory device to the power-off state or the power consumption saving mode such as the stand-by state, the semiconductor memory device enters into a self-refresh mode. An internal address designating a starting address is automatically generated and subsequently subjected to an automatic count-up, whereby word lines designated by the internal addresses and connected to gates of the cell selecting MOS transistors, such as the first and third addresses WL01 and WL03 are sequentially selected, and the cell selecting MOS transistors connected to the selected word lines such as the cell selecting MOS transistors 8-1 and 8-2 are sequentially placed into the conductive state. As a result, the data stored in the storage capacitive elements 4-1 and 4-2 are sequentially read out and transferred through the cell selecting MOS transistors 8-1 and 8-2 to the first and second bit lines BL01 and BL02 sequentially. These read out operations are the same as the sense operations of the normal DRAM.

As a result of the above operations, the first and second bit lines BL01 and BL02 sequentially sense potentials respective corresponding to the respective data stored in the storage capacitive elements 4-1 and 4-2, so that the first and second bit lines BL01 and BL02 are sequentially fixed at the respective potentials corresponding to the respective data stored in the storage capacitive elements 4-1 and 4-2, thereby to sequentially refresh the respective data stored in the storage capacitive elements 4-1 and 4-2 which are respectively conducted to the first and second bit lines BL01 and BL02.

For example, if high level data are stored in the storage capacitive 20 element 4-1 in the first memory cell CELL01, then the first bit line BL01 is fixed at the high level. If low level data are stored in the storage capacitive element 4-1 in the first memory cell CELL01, then the first bit line BL01 is fixed at the low level. If high level data are stored in the storage capacitive element 4-2 in the second memory cell CELL02, then the second bit line BL02 is fixed at the high level. If low level data are stored in the storage capacitive element 4-2 in the second memory cell CELL02, then the second bit line BL02 is fixed at the low level.

As described above, in the state where the cell selecting MOS transistor 8-1 is placed in the conductive state and the first bit line BL01 is fixed at the potential corresponding to the data stored in the storage capacitive element 4-1, the second word line WL02 is selected to place the non-volatile memory element 7-1 into the conductive state, whereby both the cell selecting MOS transistor 8-1 and the non-volatile memory element 7-1 connected in series between the paired first and second bit lines BL01 and BL02 are placed into the conductive state.

The paired first and second bit lines BL01 and BL02 have already been fixed at the high level and the low level, respectively. As described above, the paired first and second bit lines BL01 and BL02 are applied with relatively inverted signals to each other. Namely, if the first bit line BL01 is fixed at the high level, then the second bit line BL02 is fixed at the low level. If the first bit line BL02 is fixed at the low level, then the second bit line BL02 is fixed at the high level.

Namely, the paired first and second bit lines BL01 and BL02 are fixed at different voltage levels from each other. Further, both the cell selecting MOS transistor 8-1 and the non-volatile memory element 7-1 connected in series between the paired first and second bit lines BL01 and BL02 are placed into the conductive state. A current flows between the paired first and second bit lines BL01 and BL02 through the series connection of the cell selecting MOS transistor 8-1 and the non-volatile memory clement 7-1 until a potential difference between the paired first and second bit lines BL01 and BL02 becomes substantially zero or extremely small. A direction of the current between the paired first and second bit lines BL01 and BL02 depends on a potential relationship between the paired first and second bit lines BL01 and BL02.

For example, if the first bit line BL01 is fixed at the high level, while the second bit line BL02 is fixed at the low level, then a current flows from the first bit line BL01 through the cell selecting MOS transistor 8-1 and the non-volatile memory element 7-1 to the second bit line BL02. If the first bit line BL01 is fixed at the low level, while the second bit line BL02 is fixed at the high level, then another current flows from the second bit line BL02 through the non-volatile memory element 7-1 and the cell selecting MOS transistor 8-1 to the first bit line BL01.

A data storing operation for storing the data into the non-volatile memory element 7-1 depends upon the direction of the current between the first and second bit lines BL01 and BL02. This data storing operation is also based on the design of the non-volatile memory element 7-1. For example, the non-volatile memory element 7-1 may be designed as follows. If the current flows from the first bit line BL01 to the second bit line BL02, then the data storing operation is made by a hot carrier injection into the non-volatile memory element 7-1. If the current flows from the second bit line BL02 to the first bit line BL01, then no data storing operation is made by no hot carrier injection into the non-volatile memory element 7-1. Alternatively, the non-volatile memory element 7-1 may be designed as follows. If the current flows from the second bit line BL02 to the first bit line BL01, then the data storing operation is made by a hot carrier injection into the non-volatile memory element 7-1. If the current flows from the first bit line BL01 to the second bit line BL02, then no data storing operation is made by no hot carrier injection into the non-volatile memory element 7-1.

In any event, the non-volatile memory element 7-1 is designed so that the data storage operation depends on the direction of the current between the first and second bit lines BL01 and BL02.

The last description are of course applicable to the second memory cell CELL02. In the state where the cell selecting MOS transistor 8-2 is placed in the conductive state and the second bit line BL02 is fixed at the potential corresponding to the data stored in the storage capacitive element 4-2, the fourth word line WL04 is selected to place the non-volatile memory element 7-2 into the conductive state, whereby both the cell selecting MOS transistor 8-2 and the non-volatile memory element 7-2 connected in series between the paired first and second bit lines BL01 and BL02 are placed into the conductive state.

The paired first and second bit lines BL01 and BL02 have already been fixed at the high level and the low level, respectively. As described above, the paired first and second bit lines BL01 and BL02 are applied with relatively inverted signals to each other. Namely, if the first bit line BL01 is fixed at the high level, then the second bit line BL02 is fixed at the low level. If the first bit line BL01 is fixed at the low level, then the second bit line BL02 is fixed at the high level.

Namely, the paired first and second bit lines BL01 and BL02 are fixed at different voltage levels from each other. Further, both the cell selecting MOS transistor 8-2 and the non-volatile memory element 7-2 connected in series between the paired first and second bit lines BL01 and BL02 are placed into the conductive state. A current flows between the paired first and second bit limes BL01 and BL02 through the series connection of the cell selecting MOS transistor 8-2 and the non-volatile memory element 7-2 until a potential difference between the paired first and second bit lines BL01 and BL02 becomes substantially zero or extremely small. A direction of the current between the paired first and second bit lines BL01 and BL02 depends on a potential relationship between the paired first and second bit lines BL01 and BL02.

For example, if the first bit line BL01 is fixed at the high level, while the second bit line BL02 is fixed at the low level, then a current flows from the first bit line BL01 through the cell selecting MOS transistor 8-2 and the non-volatile memory element 7-2 to the second bit line BL02. If the first bit line BL01 is fixed at the low level, while the second bit line BL02 is fixed at the high level, then another current flows from the second bit line BL02 through the non-volatile memory element 7-2 and the cell selecting MOS transistor 8-2 to the first bit line BL01.

A data storing operation for storing the data into the non-volatile memory element 7-2 depends upon the direction of the current between the first and second bit lines BL01 and BL02. This data storing operation is also based on the design of the non-volatile memory element 7-2. For example, the non-volatile memory element 7-2 may be designed as follows. If the current flows from the first bit line BL01 to the second bit line BL02, then the data storing operation is made by a hot carrier injection into the non-volatile memory element 7-2. If the current flows from the second bit line BL02 to the first bit line BL01, then no data storing operation is made by no hot carrier injection into the non-volatile memory element 7-2. Alternatively, the non-volatile memory element 7-2 may be designed as follows. If the current flows from the second bit line BL02 to the first bit line BL01, then the data storing operation is made by a hot carrier injection into the non-volatile memory element 7-2. If the current flows from the first bit line BL01 to the second bit line BL02, then no data storing operation is made by no hot carrier injection into the non-volatile memory element 7-2.

In any event, the non-volatile memory element 7-2 is designed so that the data storage operation depends on the direction of the current between the first and second bit lines BL01 and BL02.

Figure 5:
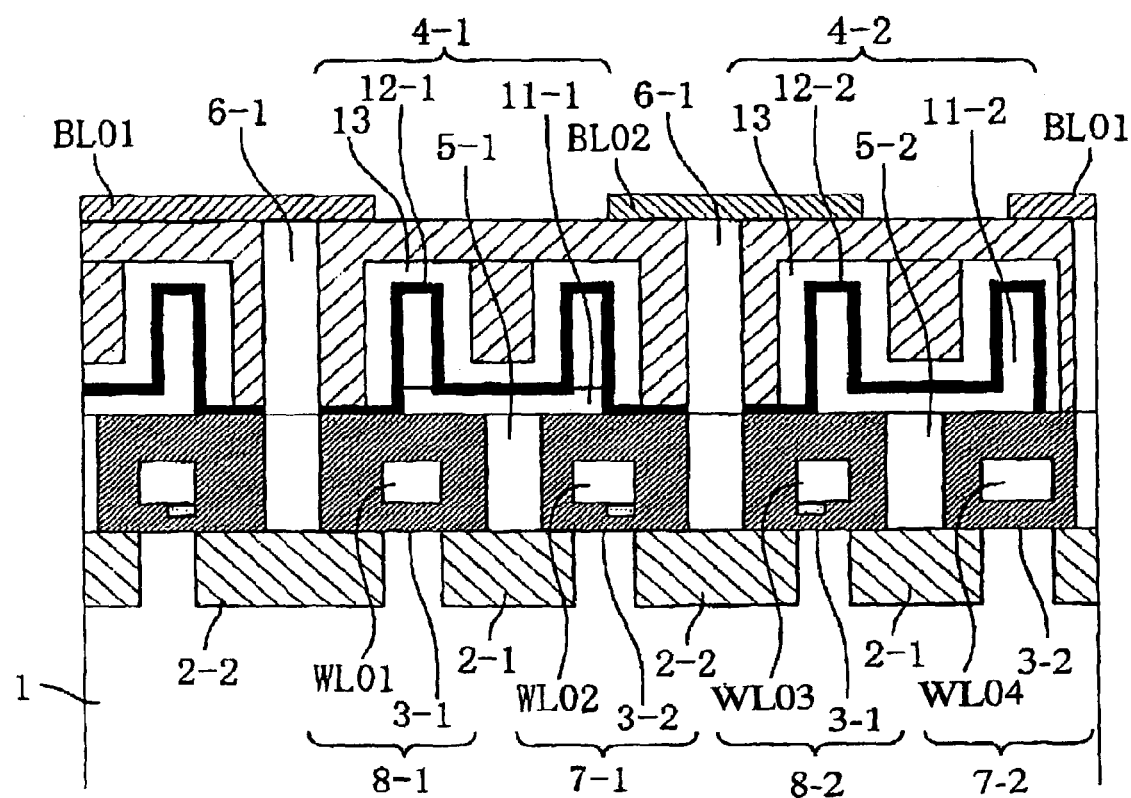
FIG. 5 is a fragmentary cross sectional elevation view of a typical example of the novel memory cell structure of the semiconductor memory device in accordance with the present invention.

A mechanism of the above-described data storing operation of storing the data into the non-volatile memory element will be described in more detail. FIG. 5 is a fragmentary cross sectional elevation view of a typical example of the above-described novel memory cell structure of the semiconductor memory device in accordance with the present invention. A memory cell array is provided over a semiconductor substrate 1. Only adjacent two first and second memory cells CELL01 and CELL02 are illustrated in FIG. 5. The first memory cell CELL01 comprises the cell selecting MOS transistor 8-1, the storage capacitive element 4-1 and the non-volatile memory element 7-1. The second memory cell CELL02 comprises the cell selecting MOS transistor 8-2, the storage capacitive element 4-2 and the non-volatile memory element 7-2.

The cell selecting MOS transistor 8-1 further comprises an impurity diffusion region 2-2 connected through a bit line contact 6-1 to the first bit line BL01, an impurity diffusion region 2-1 connected through a storage electrode contact 5-1 to a storage electrode 11-1 of the storage capacitive element 4-1, a gate insulating film 3-1, and a gate electrode connected to the first word line WL01.

The storage capacitive element 4-1 further comprises the storage electrode 11-1 connected through the storage electrode contact 5-1 to the impurity diffusion region 2-1, a capacitive insulation film 12-1 and an opposite electrode 13.

The non-volatile memory element 7-1 further comprises the impurity diffusion region 2-1 connected through the storage electrode contact 5-1 to the storage electrode 11-1 of the storage capacitive element 4-1, the impurity diffusion region 2-2 connected through the bit line contact 6-1 to the second bit line BL02, a gate insulating film 3-2, and a floating gate electrode electrically floating in the gate insulating film 3-2, and a control gate electrode connected to the second word line WL02.

The cell selecting MOS transistor 8-2 further comprises the impurity diffusion region 2-2 connected through the bit line contact 6-1 to the second bit line BL02, the impurity diffusion region 2-1 connected through a storage electrode contact 5-2 to a storage electrode 11-2 of the storage capacitive element 4-2, the gate insulating film 3-1, and a gate electrode connected to the third word line WL03.

The storage capacitive element 4-2 further comprises the storage electrode 11-2 connected through the storage electrode contact 5-2 to the impurity diffusion region 2-1, a capacitive insulation film 12-2 and the opposite electrode 13.

The non-volatile memory element 7-2 further comprises the impurity diffusion region 2-1 connected through the storage electrode contact 5-2 to the storage electrode 11-2 of the storage capacitive element 4-2, the impurity diffusion region 2-2 connected through the bit line contact 6-1 to the first bit line BL01, the gate insulating film 3-2, and a floating gate electrode electrically floating in the gate insulating film 3-2, and a control gate electrode connected to the fourth word line WL04.

The gate insulating films 3-2 of the non-volatile memory elements 7-1 and 7-2 may comprise any one of a variety of the known and available gate insulating film structures. The following descriptions will be made by taking one example that a hot carrier injection region is selectively formed in a first half region of the gate insulation film under the control gate electrode, wherein the first half region is closer to the bit line contact 6-1. It is not necessary to limit the gate insulating film structure into the following structure.

Figure 6:
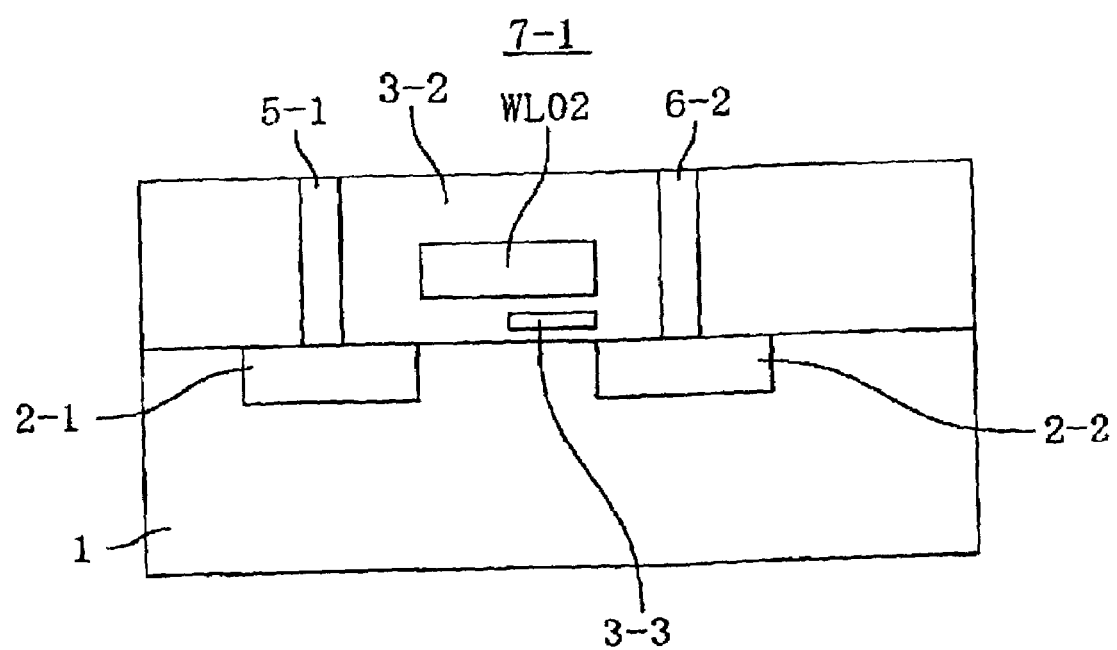
FIG. 6 is a fragmentary cross sectional elevation view of a first typical example of a gate insulating film structure of the non-volatile memory element included in the memory cell structure shown in FIG. 5, wherein a hot carrier injection region is selectively formed in a first half region under a control gate electrode.

FIG. 6 is a fragmentary cross sectional elevation view of a first typical example of a gate insulating film structure of the non-volatile memory element included in the memory cell structure shown in FIG. 5, wherein a hot carrier injection region is selectively formed in a first half region under a control gate electrode. The non-volatile memory element 7-1 is formed over a semiconductor substrate 1. The non-volatile memory element 7-1 comprises impurity diffusion regions 2-1 and 2-2 selectively formed in upper regions of the semiconductor substrate 1. A gate insulating film 3-2 extends over the semiconductor substrate 1. A bit line contact 6-1 is formed in the gate insulating film 3-2, wherein the bit line contact 6-1 is communicated with a part of the impurity diffusion region 2-2. A storage electrode contact 5-1 is also formed in the gate insulating film 3-2, wherein the storage electrode contact 5-1 is communicated with a part of the impurity diffusion region 2-1.

A control gate electrode comprising a part of the second word line WL02 is positioned in the gate insulating film 3-2, and over a channel region between the impurity diffusion regions 2-1 and 2-2. The control gate electrode WL02 is separated from the channel region by a part of the gate insulating film 3-2. A floating gate electrode 3-3 is formed in a first half region of the gate insulating film under the gate control electrode WL02 and over the channel region, wherein the first half region is closer to the bit line contact 6-1. The floating gate electrode 3-3 is electrically isolated or floated by the gate insulating film 3-2. The hot carrier injection into the floating gate electrode 3-3 is caused in the first half region closer to the bit line contact 6-1.

Figure 7:
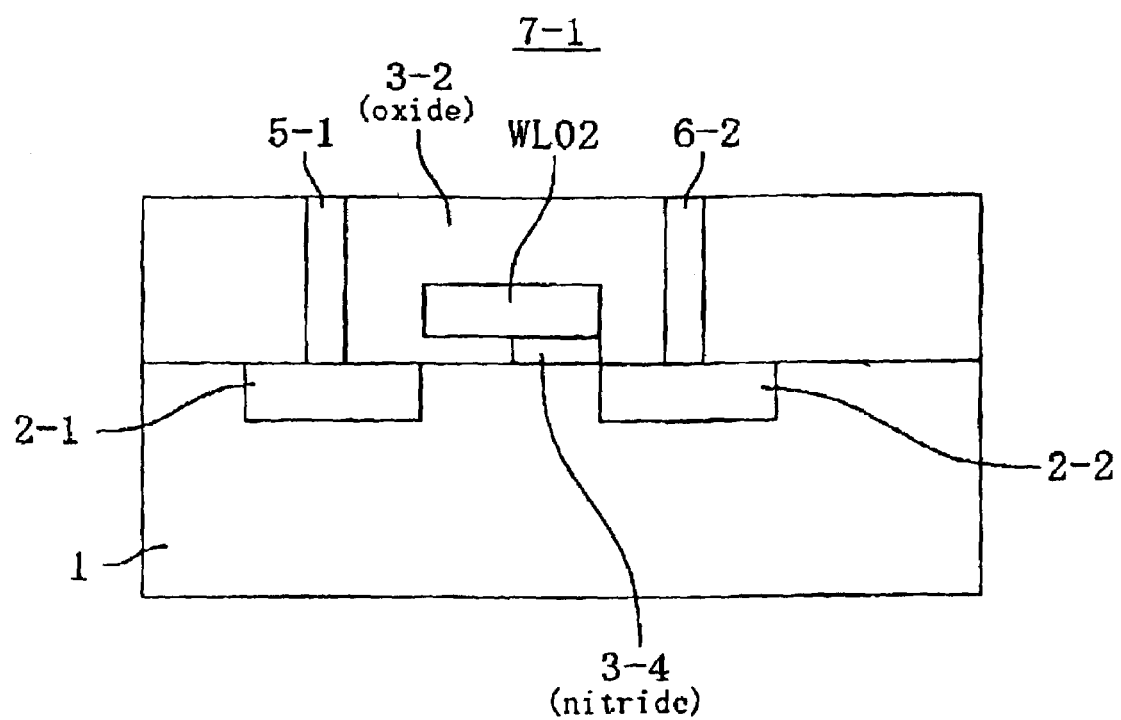
FIG. 7 is a fragmentary cross sectional elevation view of a second typical example of a gate insulating film structure of the non-volatile memory element included in the memory cell structure shown in FIG. 5, wherein a hot carrier injection region is selectively formed in a first half region under a control gate electrode.

FIG. 7 is a fragmentary cross sectional elevation view of a second typical example of a gate insulating film structure of the non-volatile memory element included in the memory cell structure shown in FIG. 5, wherein a hot carrier injection region is selectively formed in a first half region under a control gate electrode. The non-volatile memory element 7-1 is formed over a semiconductor substrate 1. The non-volatile memory element 7-1 comprises impurity diffusion regions 2-1 and 2-2 selectively formed in upper regions of the semiconductor substrate 1. A gate insulating film 3-2 extends over the semiconductor substrate 1. This gate insulating film 3-2 may comprise an oxide film except for a hot carrier injection region. A bit line contact 6-1 is formed in the gate insulating film 3-2, wherein the bit line contact 6-1 is communicated with a part of the impurity diffusion region 2-2. A storage electrode contact 5-1 is also formed in the gate insulating film 3-2, wherein the storage electrode contact 5-1 is communicated with a part of the impurity diffusion region 2-1.

A control gate electrode comprising a part of the second word line WL02 is positioned in the gate insulating film 3-2, and over a channel region between the impurity diffusion regions 2-1 and 2-2. The control gate electrode WL02 is separated from the channel region by both two insulating materials different in dielectric constant, for example, a part of the gate insulating oxide film 3-2 and an oxide-nitride-oxide film 3-4 which is positioned in a first half region of the gate insulating structure under the gate control electrode WL02 and over the channel region, wherein the first half region is closer to the bit line contact 6-1. The oxide-nitride-oxide film 3-4 is different in dielectric constant from the oxide film 3-2. Namely, the hot carrier injection region comprises the oxide-nitride-oxide film 3-4. The hot carrier injection through the oxide-nitride-oxide film 3-4 into the floating gate electrode 3-3 is caused in the first half region closer to the bit line contact 6-1.

Both the above two gate insulating structures shown in FIGS. 6 and 7 allow the same data storing operations of storing the data into the non-volatile memory element 7-1. The data storing operations of storing the data into the non-volatile memory element 7-1 will be described with reference again to FIG. 5.

The first word line WL01 is selected to place the cell selecting MOS transistor 8-1 into the conductive state, thereby to make a conductive path through the cell selecting MOS transistor 8-1 between the first bit line BL01 and the storage electrode 11-1 of the storage capacitive element 4-1. The first bit line BL01 is fixed at the same potential as the storage electrode 11-1 of the storage capacitive element 4-1. In this state, the second word line WL02 is selected to place the non-volatile memory element 7-1 into the conductive state, thereby to make a conductive path through a series connection of the cell selecting MOS transistor 8-1 and the non-volatile memory element 7-1 between the first and second bit lines BL01 and BL02.

If the data stored in the storage capacitive element 4-1 are high level, then the first bit line BL01 is fixed at the high level, while the second bit line BL02 is fixed at the low level. The impurity diffusion region 2-1 connected through the storage electrode contact 5-1 to the storage electrode 11-1 of the storage capacitive element 4-1 becomes high level, while the impurity diffusion region 2-2 connected through the bit line contact 6-1 to the second bit line BL02 become low level.

The hot carrier injection region of the non-volatile memory element 7-1 is positioned closer to the impurity diffusion region 2-2 of the low level. A channel region is formed directly under the hot carrier injection region, while no pinch-off region is formed. No hot carrier is generated in the channel region directly under the hot carrier injection region. No hot carrier injection is caused. No data are stored into the non-volatile memory element 7-1. If the semiconductor substrate is a p-type semiconductor substrate and the impurity diffusion regions 2-1 and 2-2 are n-type impurity diffusion regions, then the hot carriers are hot electrons.

If the data stored in the storage capacitive element 4-1 are low level, then the first bit line BL01 is fixed at the low level, while the second bit line BL02 is fixed at the high level. The impurity diffusion region 2-1 connected through the storage electrode contact 5-1 to the storage electrode 11-1 of the storage capacitive element 4-1 becomes low level, while the impurity diffusion region 2-2 connected through the bit line contact 6-1 to the second bit line BL02 become high level.

The hot carrier injection region of the non-volatile memory element 7-1 is positioned closer to the impurity diffusion region 2-2 of the high level. No channel region is formed directly under the hot carrier injection region, while a pinch-off region is formed directly under the hot carrier injection region. Hot carriers are generated in the pinch-off region directly under the hot carrier injection region. The hot carrier injection into the non-volatile memory element 7-1 is caused, whereby data are stored in the non-volatile memory element 7-1. As a result, the threshold voltage of the non-volatile memory element 7-1 or a threshold value of the voltage to be applied to the second word line WL02 becomes large or is increased. This phenomenon is based on the same principle as in the data storing operation in the normal EPROM. Detailed descriptions of the phenomenon will be omitted.

The above descriptions of the mechanism of the data storing operation into the non-volatile memory element 7-1 in the first memory cell CELL01 are also applicable to the mechanism of the data storing operation into the non-volatile memory element 7-2 in the second memory cell CELL02. Duplicate descriptions of the mechanism for the second memory cell CELL02 will also be omitted.

The data storing operation into the non-volatile memory element in each of the memory cells may be made in a page mode used in the normal DRAM. Namely, there is allowable a batch-data storing operation of batch-storing data into memory cells with the same row address, which are connected to a selected single word line designated with the same row address. A series of the data storing operations is carried out each time of the self-refresh operations, wherein all row addresses are scanned one time, whereby data transfer operations from the storage capacitive elements to the non-volatile memory elements are carried out for all of the memory cells. This data store operation in the page mode is effective for the requirement for high speed performance, but not essential to be conducted.

If the non-volatile memory element is in the non-selected state, then the cell selecting MOS transistor paired with this non-selected non-volatile memory element in the same memory cell is in the non-conductive state. For this reason, no through current flows between the first and second bit lines BL01 and BL02 in this memory cell. Any abnormal data storing into the non-selected non-volatile memory element so called as "snake path" is not caused whereby the state of the non-selected non-volatile memory element remains unchanged.

After the above data transfer operation has been completed, then the semiconductor memory device enters into the power-off state or the power consumption saving state such as the stand-by state. Differently from the normal DRAM operation, in accordance with the present invention, no refresh operation is made during the power-off state or the power consumption saving state such as the stand-by state. Even if the data are lost from the storage capacitive element due to no refresh operation, then the non-volatile memory element securely holds the same data as once stored in the storage capacitive element. No refresh operation is made during the power-off state or the power consumption saving state such as the stand-by state results in a certain reduction in the power consumption of the semiconductor memory device.

The semiconductor memory device is placed into the power-on state again, and then the data stored in the non-volatile memory element are read out and transferred to the storage capacitive element, whereby the memory state is returned to the past memory state just before the entry into the power-off state or the power consumption saving state such as the stand-by state. As a result, the semiconductor memory device operates in the normal operation mode under the same memory state as the past memory state just before the entry into the power-off state or the power consumption saving state such as the stand-by state. The operations of the data transfer from the non-volatile memory element to the storage capacitive element will be described below.

The semiconductor memory device is placed into the power-on state, whereby the potential of the opposite electrode of the storage capacitive element in each of the memory cells is boosted up to an intermediate voltage level of ½ Vcc from the ground level, wherein Vcc is the power voltage. As a result, the semiconductor memory device automatically enters into the refresh operation of uniformly refreshing the cell data stored in the storage electrode of the storage capacitive element at the high level. All of the bit lines are previously fixed at the low level. This operation corresponds to the initialization operation used in the normal DRAM.

After all of the bit lines are fixed at the low level, then the potential of the control gate electrode is increased up to an appropriate high potential. As described above, since the threshold voltage of the selected non-volatile memory element, which has stored the data, has been increased, there is a difference in the threshold voltage between the selected non-volatile memory element, which has stored the data, and the non-selected non-volatile memory element, which has not stored any data. The above appropriate high potential is so set or determined that the gate voltage places, into the non-conductive state, the selected non-volatile memory element, which stored the data and has the increased threshold voltage, and further places, into the conductive state, the non-selected non-volatile memory element, which did not store any data and has the non-increased or original threshold voltage. The boosted voltage is lower than the increased threshold voltage and higher than the original threshold voltage. This boosting up operation may be made sequentially or at one time.

Thereafter, all of the bit lines are fixed at the high level. The non-selected non-volatile memory element is in the initial state or the conductive state. The high level data are transferred through the non-selected non-volatile memory element in the conductive state to the storage electrode of the storage capacitive element included together with the non-selected non-volatile memory element in the same memory cell. The selected non-volatile memory element, which stored the data, has the increased threshold voltage, and is placed in the non-conductive state. The high level data are not transferred through the selected non-volatile memory element in the non-conductive state to the storage electrode of the storage capacitive element included together with the selected non-volatile memory element in the same memory cell. As a result, the previous low level data remain in the storage electrode of the storage capacitive element. The memory state is back to the state just before the entry into the power-off state or the power consumption saving state such as the stand-by state.

The above operation will be described again in more detail with reference to FIG. 5, with focusing onto the first memory cell CELL01. In case that the high level data have been stored in the storage capacitive element 4-1 when the request for transition into the power-off state or the power consumption saving state such as the stand-by state is generated, the first bit line BL01 is fixed at the high level, while the second bit line BL02 is fixed at the low level. Any hot carrier injection into the non-volatile memory element 7-1 is not caused. Thus, any data storing operation into the non-volatile memory element 7-1 is not carried out. No shift nor change of the threshold voltage of the non-volatile memory element 7-1 is caused.

The semiconductor memory device is then returned to the power-on state. The second word line WL02 increases the potential so that the potential is lower than the increased or shifted threshold voltage and higher than the non-shifted or non-increased threshold voltage. As a result, the non-volatile memory element 7-1 is placed into the conductive state. Thereafter, the high level data are written into all of the bit lines. Namely, the high level data are also stored into the second bit line BL02. The high level data are transferred through the non-volatile memory element 7-1 to the storage electrode 11-1 of the storage capacitive element 4-1. The high level data, which was stored in the storage capacitive element 4-1 before the transition into the power-off state or the power consumption saving state such as the stand-by state, again appear in the storage capacitive element 4-1 for the transition into the power-state.

In case that the low level data have been stored in the storage capacitive element 4-1 when the request for transition into the power-off state or the power consumption saving state such as the stand-by state is generated, the first bit line BL01 is fixed at the low level, while the second bit line BL02 is fixed at the high level. A hot carrier injection into the non-volatile memory element 7-1 is caused. Thus, the data storing operation into the non-volatile memory element 7-1 is carried out. The threshold voltage of the non-volatile memory element 7-1 is increased or shifted up.

The semiconductor memory device is then returned to the power-on state. The second word line WL02 connected to the non-volatile memory element 7-1 increases the potential so that the potential is lower than the increased or shifted threshold voltage and higher than the non-shifted or non-increased threshold voltage. As a result, the non-volatile memory element 7-1 is placed into the non-conductive state. Thereafter, the high level data are written onto all of the bit lines. Namely, the high level data are also stored onto the second bit line BL02. Since the non-volatile memory element 7-1 is in the non-conductive state, the high level data are not transferred through the non-volatile memory element 7-1 to the storage electrode 11-1 of the storage capacitive element 4-1. The low level data, which was stored in the storage capacitive element 4-1 before the transition into the power-off state or the power consumption saving state such as the stand-by state, again appear in the storage capacitive element 4-1 for the transition into the power-state.

Accordingly, all of the memory cells are returned to the past memory state just before the entry into the power-off state or the power consumption saving state such as the stand-by state. It is necessary to erase the data once stored in the non-volatile memory element. For this purpose, a negative voltage is uniformly applied to the word lines which are connected to the control gate electrodes of the non-volatile memory elements to draw carriers or electrons out of the non-volatile memory element, whereby the data stored in the non-volatile memory element is erased. As long as the negative voltage is applied to the control gate electrode of the non-volatile memory element, the non-volatile memory element remains in the non-conductive state. This data erasing operation is similar to that of the normal Flash memory.

It should, however, be noted for the data erasing operation that the negative voltage to be applied to the control gate electrode of the non-volatile memory element should be set so as to avoid any over-erasing to the non-volatile memory element. Further, it is preferable to perform the data erasing operation to the non-volatile memory element sequentially for each word, with keeping the voltage level of the selected word line immediately after the refresh operation, in order to avoid breaking data again re-stored in the storage capacitive element.

After a series of the data erasing operations has been completed, then a selecting value of the non-volatile memory element is fixed at the ground level. Thereafter, the semiconductor memory device shows the same read/write operations as the normal DRAM operation in the normal operation mode.

Figure 8:
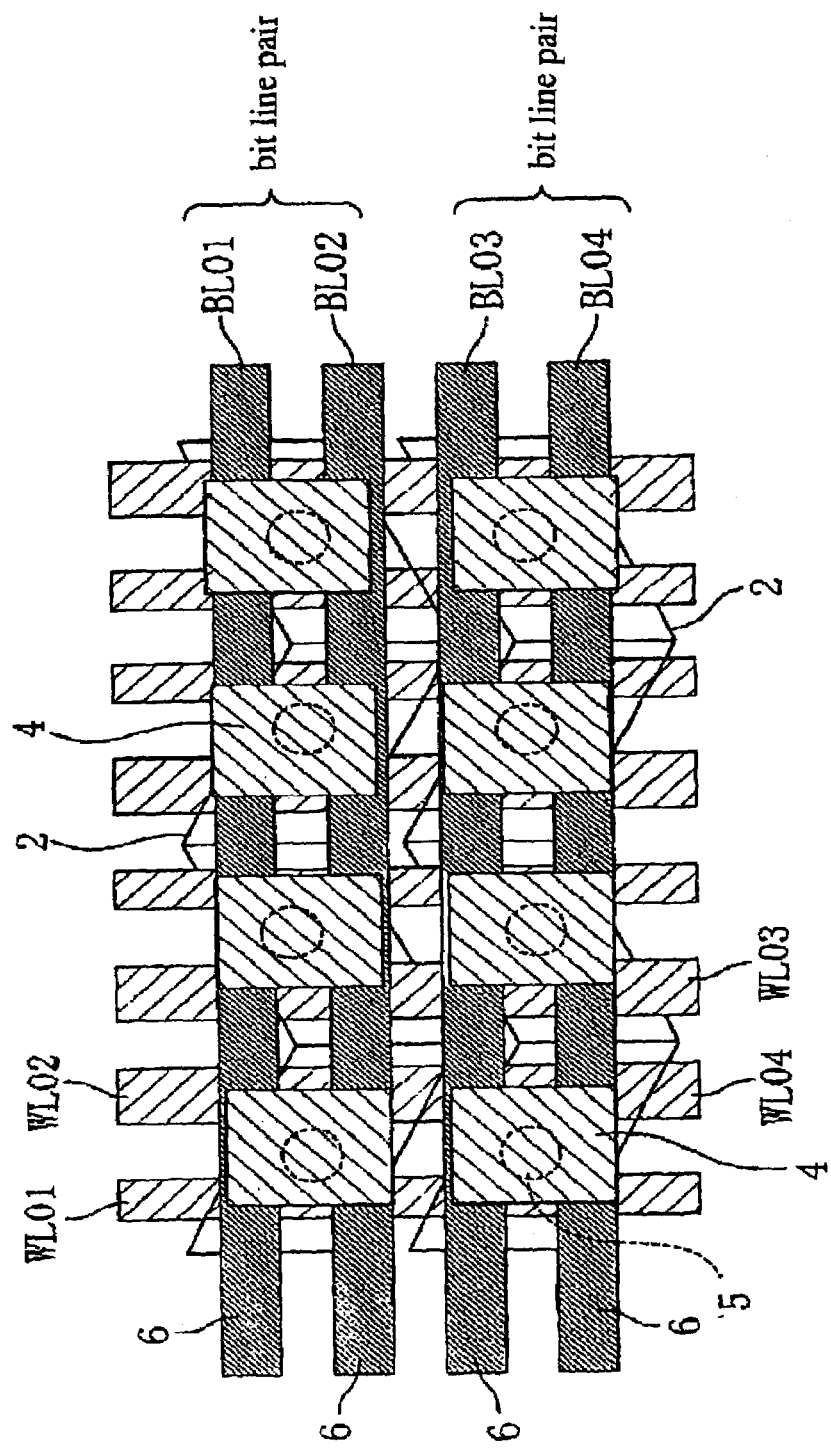
FIG. 8 is a fragmentary schematic plan view of one example of layout of the memory cells of the semiconductor memory device in accordance with the present invention.

FIG. 8 is a fragmentary schematic plan view of one example of layout of the memory cells of the semiconductor memory device in accordance with the present invention. FIG. 8 shows two pairs of bit lines, storage electrodes of eight storage capacitive elements 4, four pairs of word lines and impurity diffusion regions, but other structural elements are not illustrated.

Paired first and second bit lines BL01 and BL02 are connected to a single sense amplifier which is not illustrated, so that the paired first and second bit lines BL01 and BL02 are applied with relative-inverse bit signals. Other paired third and fourth bit lines BL03 and BL04 are connected to another single sense amplifier which is not illustrated, so that the paired third and fourth bit lines BL03 and BL04 are also applied with relative-inverse bit signals. The layout has a folded bit line structure in the DRAM array layout. This folded bit line structure is one example of the preferable bit line layouts and thus is not essential structure. Any other bit line structure such as an open bit line structure is also applicable to the present invention.

As shown in FIGS. 5 and 8, the storage electrode contact to the storage capacitive element is common to both the non-volatile memory element and the cell selecting MOS transistor, both of which are adjacent to each other, in order to suppress or reduce an occupied area of the memory cells.

In addition, the bit line contact to the bit line is also common to adjacent two of the non-volatile memory elements and the cell selecting MOS transistors, in order to suppress or reduce an occupied area of the memory cells.

Further, the opposite electrode of the storage capacitive elements is also common to both the adjacent two memory cells, in order to suppress or reduce an occupied area of the memory cells.

As described above, in accordance with the semiconductor memory device of the present invention, each memory cell comprises a single pair of a volatile memory element and a non-volatile memory element which are electrically coupled to each other. The volatile memory element is electrically coupled to first one of paired bit lines. The non-volatile memory element is electrically coupled to second one of the paired bit lines. The volatile memory element and the non-volatile memory element respectively comprise elements physically different from each other. In the normal operation mode for read write operations, only the volatile memory element operates, while the non-volatile memory element does not operate and is in a resting state. In the data holding mode, only the non-volatile memory element operates, while the volatile memory element does not operate and is in the resting state. Namely, when the semiconductor memory device is transitioned from the normal operation mode to the data holding mode, data are written or stored into the non-volatile memory element. When the semiconductor memory device is transitioned from the data holding mode to the normal operation mode, the stored data are read from the non-volatile memory element.

In a case that the non-volatile memory element comprises a non-volatile memory transistor, this non-volatile memory transistor does not operate in the normal operation mode for the data read and write operations. This non-volatile memory transistor is not needed to have the high speed performance of the ON/OFF switching operations as the selecting transistor used in the normal DRAM cell, and further a gate insulating film material of this non-volatile memory transistor is also not needed to have a high quality and a high cyclic characteristic or a high durability. Namely, the presently available non-volatile memory transistors are available for the non-volatile memory transistor included in the semiconductor memory device of the present invention. Any improvement in the performances and characteristics of the presently practiced non-volatile transistor is not needed for realizing the semiconductor memory device of the present invention. This allows a high flexibility in design of the semiconductor memory device and also a possible reduction in the cost thereof.

In the normal operation mode, only the volatile memory element operates. This allows that the volatile memory element comprises a single pair of a selecting transistor and a capacitor, similarly to the conventional and normal DRAM cell, thereby making it possible to improve the high speed performance of the semiconductor memory device in the normal operation mode.

The novel memory cell structure of the present invention needs to further provide the non-volatile memory element in addition to the normal DRAM cell structure, so that the novel memory cell structure not only has the same advantages as the normal DRAM such as the high speed performance but also compensates the disadvantages of the normal DRAM, for example, does not need to perform any refresh operations during the power-off state or the power consumption saving state such as the stand-by state in order to suppress the power consumption.

Further as shown in FIGS. 5, 6 and 7, the sectioned structure of the semiconductor memory device of the present invention is different from that of the DRAM but only in view of the gate insulating structure of the non-volatile memory element. A small number of the additional fabrication processes for forming the gate insulating film structure is added to the normal fabrication processes for fabricating the normal DRAM. The fabrication processes for fabricating the novel semiconductor memory device of the present invention are identical with the fabrication processes for fabricating the normal DRAM except for the small number of the additional fabrication processes for fabricating the gate insulating film structure. These additional fabrication processes are not complicated processes nor special processes. For those reasons, the novel semiconductor memory device has the advantages of the large-scale mass-production through the existent and established manufacturing processes using the existent semiconductor manufacturing equipment, thereby realizing the desired reduction in cost.

The volatile memory element and the non-volatile memory element are integrated in the single memory cell. This allows an extremely high speed data transfer between the volatile memory element and the non-volatile memory element in the single memory cell. This realizes the desired improvement in the high speed performance of the novel semiconductor memory device. In addition, no special data transfer line is needed between the volatile memory element and the non-volatile memory element in the single memory cell. This contributes to further reduce the occupied area of the memory cell array.

The above cell structure incorporating or integrating both the volatile memory element and the non-volatile memory element in the single memory cell does not need any change in the cell array structure from the existent DRAM cell array structure. No change to the bit line layout nor addition of further bit line are necessary. With no increase of the number of the bit lines from that of the normal DRAM nor change to the connection configuration of the bit line pair and the sense amplifier from that of the normal DRAM, it is possible to suppress or reduce the occupied area of the memory cell array region as well as take a great deal of advantage of large scale mass-production with a large reduction in cost, similarly to the DRAM, through the existent and established manufacturing process techniques by using the existent semiconductor manufacturing equipment.

The present invention needs a minimum increase in the number of word lines from that of the DRAM. The single time word address scanning operation transfers data from the volatile memory element to the non-volatile memory element in each of the memory cells, without any complicated and specific word selecting operations.

The existent peripheral circuit configurations and the existent control circuit configurations usable in the DRAM are simply applicable to the above-described novel semiconductor memory device of the present invention, with no addition of any specific peripheral circuit or control circuit nor increase in the occupied area of the circuit region. This takes the same advantages as the DRAM, for example, the large-scale mass-production effect through the existent manufacturing process techniques using the existent semiconductor manufacturing equipment, thereby realizing the desired large reduction in cost.

The present invention needs a minimum increase in the number of word lines from that of the DRAM. The single time word address scanning operation transfer data from the volatile memory element to the non-volatile memory element in each of the memory cells, without any complicated and specific word selecting operations.

The existent peripheral circuit configurations and the existent control circuit configurations usable in the DRAM are simply applicable to the above-described novel semiconductor memory device of the present invention, with no addition of any specific peripheral circuit or control circuit nor increase in the occupied area of the circuit region. This takes the same advantages as the DRAM, for example, the large-scale mass-production effect through the existent manufacturing process techniques using the existent semiconductor manufacturing equipments, thereby realizing the desired large cost down.

The control operation techniques needed for the DRAM are also simply applicable to control the operations of the novel semiconductor memory device of the present invention, with no complicated control operations nor special and highly precise control operations, thereby improving the controllability and the stability of the operations thereof in addition to the above-described plural effects and advantages.

The novel semiconductor memory device of the present invention needs the minimum operations for transfer of data between the volatile memory element and the non-volatile memory element in the same memory cell, in order to reduce the number of the necessary injection of hot carriers into the non-volatile memory element. This reduction in the number of the necessary hot carrier injection relaxes the requirements for the durability of the non-volatile memory element, particularly for the film quality of the gate insulating film thereof. This relaxation increases the design flexibility of the memory cell structure, and also improve the yield of the semiconductor memory device.

Each storage electrode contact with the storage electrode of the storage capacitive element is common to both the non-volatile memory element and the cell selecting MOS transistor, both of which are included in the single memory cell, in order to suppress or reduce the occupied area of the memory cells.

In addition, the bit line contact to the bit line is also common to adjacent two of the non-volatile memory elements and the cell selecting MOS transistors, in order to suppress or reduce an occupied area of the memory cells.

Further, the opposite electrode of the storage capacitive elements is also common to both the adjacent two memory cells, in order to suppress or reduce an occupied area of the memory cells.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A semiconductor memory device including a plurality of memory cells, each of said plural memory cells comprising a single pair of a volatile memory element and a non-volatile memory element,
    wherein said volatile memory element and said non-volatile memory element are electrically coupled to each other, and
    wherein said volatile memory element is also electrically coupled to a first bit line for transmitting a first bit signal, while said non-volatile memory element is also electrically coupled to a second bit line, said first bit line making a single pair with said second bit line, said second bit line for transmitting a second bit signal which is an inversion to said first bit signal,
    said non-volatile memory element comprising a gate electrode closer to a contact contacting said second bit line than to a contact not contacting said first bit line and included in said volatile memory element.

2. The semiconductor memory device as claimed in claim 1, wherein said volatile memory element includes a cell selecting element, and said cell selecting element and said non-volatile memory element are connected in series between said first and second bit lines.

3. The semiconductor memory device as claimed in claim 1,
    wherein said volatile memory element comprises a cell selecting element and a storage capacitive element,
    wherein said cell selecting element and said non-volatile memory element are connected in series between said first and second bit lines, and
    wherein a storage electrode of said storage capacitive element is electrically connected through said cell selecting element to said first bit line, and also is electrically connected through said non-volatile memory element to said second bit line.

4. The semiconductor memory device as claimed in claim 3, wherein said cell selecting element comprises a MOS transistor, and said non-volatile memory element comprises a memory element which varies in a threshold voltage of a control electrode upon a hot carrier injection.

5. The semiconductor memory device as claimed in claim 3, wherein said cell selecting element and said non-volatile memory element, both of which are included in each of said plural memory cells, are commonly connected through a single common storage electrode contact to said storage electrode of said storage capacitive element.

6. The semiconductor memory device as claimed in claim 5, wherein said cell selecting element and said non-volatile memory element, both of which are respectively included in adjacent two of said plural memory cells aligned in a direction substantially perpendicular to an extending direction of said first and second bit lines, are commonly connected through a single common bit line contact to one of said first and second bit lines.

7. The semiconductor memory device as claimed in claim 6, wherein said cell selecting element and said non-volatile memory element, both of which are respectively included in adjacent two of said plural memory cells aligned in said extending direction of said first and second bit lines, are electrically connected to the same one of said first and second bit lines.

8. A memory cell structure comprising a plurality of memory cells, each of said plural memory cells comprising a single pair of a volatile memory element and a non-volatile memory element,
    wherein said volatile memory element and said non-volatile memory element are electrically coupled to each other, and
    wherein said volatile memory element is also electrically coupled to a first bit line for transmitting a first bit signal, while said non-volatile memory element is also electrically coupled to a second bit line, said first bit line making a single pair with said second bit line, said second bit line for transmitting a second bit signal which is an inversion to said first bit signal,
    said non-volatile memory element comprising a gate electrode closer to a contact contacting said second bit line than to a contact not contacting said first bit line and included in said volatile memory element.

9. The memory cell structure as claimed in claim 8, wherein said volatile memory element includes a cell selecting element, and said cell selecting element and said non-volatile memory element are connected in series between said first and second bit lines.

10. The memory cell structure as claimed in claim 8,
    wherein said volatile memory element comprises a cell selecting element and a storage capacitive element,
    wherein said cell selecting element and said non-volatile memory element are connected in series between said first and second bit lines, and
    wherein a storage electrode of said storage capacitive element is electrically connected through said cell selecting element to said first bit line, and also is electrically connected through said non-volatile memory element to said second bit line.

11. The memory cell structure as claimed in claim 10, wherein said cell selecting element comprises a MOS transistor, and said non-volatile memory element comprises a memory element which varies in a threshold voltage of a control electrode upon a hot carrier injection.

12. The memory cell structure as claimed in claim 10, wherein said cell selecting element and said non-volatile memory element, both of which are included in each of said plural memory cells, are commonly connected through a single common storage electrode contact to said storage electrode of said storage capacitive element.

13. The memory cell structure as claimed in claim 12, wherein said cell selecting element and said non-volatile memory element, both of which are respectively included in adjacent two of said plural memory cells aligned in a direction substantially perpendicular to an extending direction of said first and second bit lines, are commonly connected through a single common bit line contact to one of said first and second bit lines.

14. The memory cell structure as claimed in claim 13, wherein said cell selecting element and said non-volatile memory element, both of which are respectively included in adjacent two of said plural memory cells aligned in said extending direction of said first and second bit lines, are electrically connected to the same one of said first and second bit lines.

15. A semiconductor memory device including:
a semiconductor substrate of a first conductivity type;
first, second and third diffusion regions of a second conductivity type which are selectively formed and separated from each other in said semiconductor substrate;
a first bit line electrically connected through a first contact to said first diffusion region;
a second bit line electrically connected through a second contact to said second diffusion region, and said second bit line making a pair with said first bit line, and said first and second bit lines which respectively transmit first and second bit signals which have relative inversion relationships to each other;
a storage capacitive element electrically connected through a third contact to said third diffusion region;
a cell selecting element including a first control electrode between said first and third contacts, a first electrode region comprising said first diffusion region, and a third electrode region comprising said third diffusion region; and
a non-volatile memory element including a second control electrode between said second and third contacts, a second electrode region comprising said second diffusion region, and said third electrode region comprising said third diffusion region.

16. The semiconductor memory device as claimed in claim 15, wherein said non-volatile memory element comprises a non-volatile transistor having a floating gate electrode.

17. The semiconductor memory device as claimed in claim 16, wherein said floating gate electrode is smaller in width than said second control electrode.

18. The semiconductor memory device as claimed in claim 17, wherein said floating gate electrode is positioned under a first half region of said second control gate electrode, so that said floating gate electrode overlaps a hot carrier injection region in plan view.

19. A method of controlling operation of a semiconductor memory device including a plurality of memory cells, each of said plural memory cells comprising a single pair of a volatile memory element and a non-volatile memory element which are electrically coupled in series between paired first and second bit lines respectively transmitting first and second bit signals having relative inversion relationships to each other,
wherein, when said semiconductor memory device is in a power-on state, then said non-volatile memory element is in a non-operation state, while said volatile memory element is an operation state to store and hold cell data;
when said semiconductor memory device is transitioned from said power-on state to one of a power-off state and a power consumption saving state, then cell data stored in said volatile memory element are transferred to and stored into said non-volatile memory element;
when semiconductor memory device is in one of said power-off state and said power consumption saving state, then no refresh operation is made; and
when said semiconductor memory device is transitioned from one of said power-off state and said power consumption saving state to said power-on state, then cell data stored in said non-volatile memory element are transferred to and stored into said volatile memory element;
said transfer of said cell data stored in said volatile memory element to said non-volatile memory element occurring without said cell data traveling over said first and second bit lines.

20. The method as claimed in claim 19, wherein said transfer of said cell data to said non-volatile memory element from said volatile memory element includes the steps of:
fixing said first bit line electrically connected to said volatile memory element at a potential which corresponds to said cell data stored in said volatile memory element, and also fixing said second bit line at another potential which has an inversion relationship of said potential of said first bit line; and
placing said non-volatile memory element into a conductive state, so that a potential difference between said first and second bit lines causes a current flow between said first and second bit lines through a series connection of said volatile memory element and said non-volatile memory element, thereby storing said cell data into said non-volatile memory element.

21. The method as claimed in claim 19, wherein said transfer of said cell data to said volatile memory element from said non-volatile memory element includes the steps of:
placing said non-volatile memory element into a non-conductive state if said non-volatile memory element has stored cell data, and leaving said non-volatile memory element in a conductive state if said non-volatile memory element has not stored cell data; and
applying all of said bit lines with a voltage which corresponds to data, which had been stored in said volatile memory element before said semiconductor memory device has been transitioned from said power-on state to one of said power-off state and said power consumption saving state, where said volatile memory element is included in the same memory cell as said non-volatile memory element having no stored cell data.

22. The method as claimed in claim 21, wherein said placing step is carried out by applying a control voltage to control electrodes of all of said non-volatile memory elements, and said control voltage is lower than an increased threshold voltage of said non-volatile memory element having stored cell data, and higher than an original threshold voltage of said non-volatile memory element having no stored cell data.

23. A method of transferring data from a volatile memory element to a non-volatile memory element which is included in a single memory cell together with said volatile memory element, wherein said volatile memory element and said non-volatile memory element are connected in series between paired first and second bit lines which respectively transfer first and second bit signals having relative inversion relationships to each other, and said method including:

fixing said first bit line electrically connected to said volatile memory element at a potential which corresponds to said cell data stored in said volatile memory element, and also fixing said second bit line at another potential which has an inversion relationship to said potential of said first bit line; and placing said non-volatile memory element into a conductive state, so that a potential difference between said first and second bit lines causes a current flow between said first and second bit lines through a series connection of said volatile memory element and said non-volatile memory element, thereby storing said cell data into said non-volatile memory element;

a transfer of said cell data stored in said volatile memory element to said non-volatile memory element occurring without said cell data traveling over said first and second bit lines.

24. A method of transferring data from a non-volatile memory element to a volatile memory element which is included in a single memory cell together with said non-volatile memory element, wherein said volatile memory element and said non-volatile memory element are connected in series between paired first and second bit lines which respectively transfer first and second bit signals having relative inversion relationships to each other, and said method including:

placing said non-volatile memory element into a non-conductive state if said non-volatile memory element has stored cell data, and leaving said non-volatile memory element in a conductive state if said non-volatile memory element has not stored cell data; and applying all of said bit lines with a voltage which corresponds to data, which had been stored in said volatile memory element before said semiconductor memory device has been transitioned from said power-on state to one of said power-off state and said power consumption saving state, where said volatile memory element is included in the same memory cell as said non-volatile memory element having no stored cell data.

25. The method as claimed in claim 24, wherein said placing step is carried out by applying a control voltage to control electrodes of all of said non-volatile memory elements, and said control voltage is lower than an increased threshold voltage of said non-volatile memory element having stored cell data, and higher than an original threshold voltage of said non-volatile memory element having no stored cell data.

* * * * *